US012699300B2

(12) United States Patent
Lu

(10) Patent No.: US 12,699,300 B2
(45) Date of Patent: Aug. 4, 2026

(54) SEMICONDUCTOR DEVICES

(71) Applicant: Advanced Semiconductor Engineering, Inc., Kaohsiung (TW)

(72) Inventor: Wen-Long Lu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 755 days.

(21) Appl. No.: 18/114,180

(22) Filed: Feb. 24, 2023

(65) Prior Publication Data

US 2024/0288745 A1     Aug. 29, 2024

(51) Int. Cl.
 *G02F 1/29* (2006.01)
 *H10W 70/685* (2026.01)
 *H10W 74/10* (2026.01)
 *H10W 90/00* (2026.01)
 *H01F 7/20* (2006.01)
(52) U.S. Cl.
 CPC ........... *G02F 1/29* (2013.01); *H10W 70/685* (2026.01); *H10W 74/117* (2026.01); *H10W 90/00* (2026.01); *H01F 7/20* (2013.01); *H10W 90/701* (2026.01); *H10W 90/724* (2026.01)

(58) Field of Classification Search
 CPC ..................................................... G02F 1/3134
 See application file for complete search history.

(56) References Cited

U.S. PATENT DOCUMENTS

| 2004/0086214 | A1* | 5/2004 | Huang .................... G02F 1/093 |
| | | | 385/11 |
| 2022/0065798 | A1* | 3/2022 | Norberg ................. G01M 11/33 |
| 2022/0190924 | A1* | 6/2022 | Tomita ................. H04B 10/572 |
| 2022/0397727 | A1* | 12/2022 | Schlepple ............ G02B 6/4206 |

FOREIGN PATENT DOCUMENTS

| CN | 104698606 A | 6/2015 |
| CN | 106990474 B | 10/2019 |

* cited by examiner

*Primary Examiner* — Nicholas J Tobergte
(74) *Attorney, Agent, or Firm* — Foley and Lardner LLP

(57) ABSTRACT

A semiconductor device is provided. The semiconductor device includes a first optical transceiver, a second optical transceiver and a component. The component is configured to provide a magnetic field to change a light emitting direction from the first optical transceiver to the second optical transceiver or from the second optical transceiver to the first optical transceiver.

17 Claims, 28 Drawing Sheets

3b

70

11
11a

SEMICONDUCTOR DEVICES

BACKGROUND

1. Field of the Disclosure

The present disclosure relates to a semiconductor device including an optical sensor.

2. Description of the Related Art

While optical sensors are utilized in various applications, in consumer electronics smaller sizes are desirable. Currently, optical sensors require a large sensing area so as to collect as many optical signals as possible. As a result, the size of the optical sensor increases commensurately, which is disadvantageous to minimization of consumer electronics. Therefore, it is desired to reduce the size of a semiconductor or electronic device containing an optical sensor while maintaining performance thereof.

SUMMARY

In some embodiments, a semiconductor device includes a first optical transceiver, a second optical transceiver and a component. The component is configured to provide a magnetic field to change a light emitting direction from the first optical transceiver to the second optical transceiver or from the second optical transceiver to the first optical transceiver.

In some embodiments, a semiconductor device includes a substrate, a first optical transceiver and a signal path modulation component. The first optical transceiver is disposed on the substrate. The signal path modulation component is disposed on the first optical transceiver and configured to regulate a direction of an optical signal toward or from the first optical transceiver by electrical current.

In some embodiments, a semiconductor device includes an optical transceiver having a sensing region; a redistribution structure disposed on the optical transceiver and defining an opening exposing the sensing region of the optical transceiver, an electronic component disposed on the redistribution structure. The redistribution structure includes a first path for electrically connecting the electronic component with the optical transceiver and a second path for regulating a direction of an optical signal toward or from the optical transceiver.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
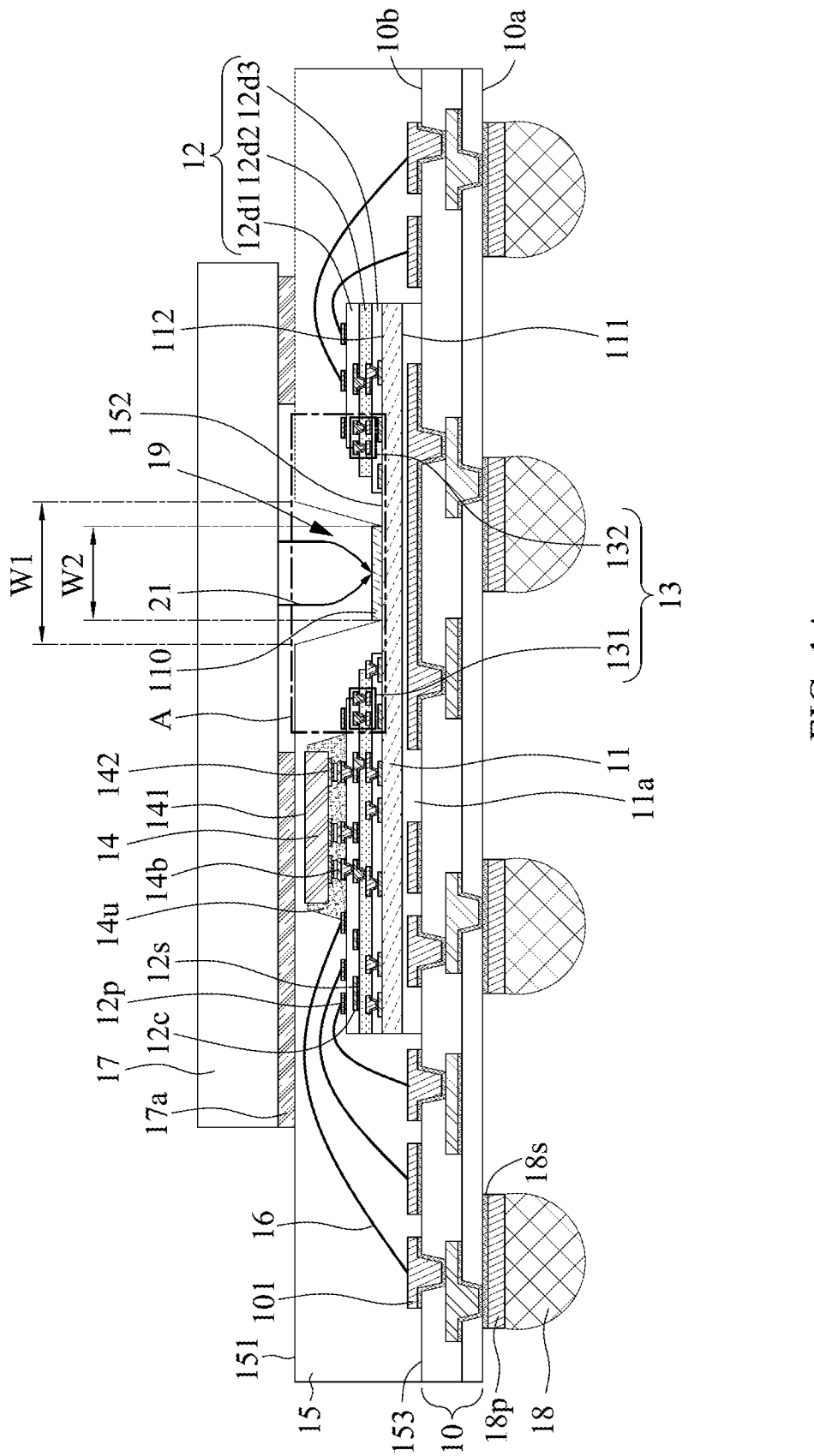
FIG. 1A is a cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a cross-sectional view of a semiconductor device 1 according to some embodiments of the present disclosure. The semiconductor device 1 may be an electronic device. In some embodiments, the semiconductor device 1 may be a semiconductor package.

Referring to FIG. 1A, the semiconductor device 1 includes a substrate 10, an optical transceiver 11, a redistribution layer or redistribution structure (referred to as "RDL") 12, a component 13, an electronic component 14, an encapsulant 15, one or more conductive wires 16, an optical transceiver 17, and one or more external connectors 18.

In some embodiments, the substrate 10 may be multilayered. The substrate 10 has a bottom surface 10a and a top surface 10b opposite to the bottom surface 10a. The substrate 10 includes substrate pads 101 disposed on the top surface 10b. The substrate 10 may further include traces or other conductive connections disposed on the top surface 10b or within the substrate 10. The substrate 10 may be a printed circuit board, for example, but is not limited thereto.

The optical transceiver 11 may be disposed on the substrate 10. In some embodiments, the optical transceiver 11 may be disposed on the top surface 10b of the substrate 10, for example, by an adhesive 11a. That is, the adhesive 11a can be disposed between the top surface 10b of the substrate 10 and the optical transceiver 11. In some embodiments, the optical transceiver 11 may be or include a sensor device or a photosensitive element, for example, but is not limited thereto. In some embodiments, the optical transceiver 11 may be or include a photonic integrated circuit (PIC). In some embodiments, the optical transceiver 11 may be or include an optical sensor. In some embodiments, the optical transceiver 11 may be or include an ASIC sensor die.

The optical transceiver 11 has a first surface 111 (e.g., a backside surface) and a second surface 112 (e.g., an active surface) opposite to the first surface 111. The second surface 112 of the optical transceiver 11 faces the substrate 10. The optical transceiver 11 has a sensing region (or a sensing area) 110 located at the second surface 112. The sensing region 110 may be embedded within the optical transceiver 11 or disposed on the second surface 112 of the optical transceiver 11. In some embodiments, the sensing region 110 can protrude from the second surface 112 of the optical transceiver 11. In another embodiments, the top surface of the sensing region 110 may be aligned with the second surface 112 of the optical transceiver 11 (not shown). In some embodiments, the sensing region 110 of the optical transceiver 11 may be or include a sensor, a photodetector, or an optical receiver. The optical transceiver 11 may include a sensing circuit disposed in the sensing region 110 for sensing or detecting optical signals 21. The optical signals 21 may be light, e.g., visible light, infrared light, or light having other wavelengths.

In some embodiments, the optical transceiver 11 may have a width in tens of micrometers (μm). In some embodiments, the width of the optical transceiver 11 may be in hundreds of millimeters (mm). In some embodiments, the thickness of the optical transceiver 11 may be in a range of 20 μm to 200 μm.

The RDL 12 may be disposed on the optical transceiver 11. In some embodiments, the RDL 12 may be formed on the second surface 112 of the optical transceiver 11. In some embodiments, the RDL 12 may be disposed adjacent to the sensing region 110 of the optical transceiver 11. In some embodiments, the RDL 12 may be disposed around the periphery of the sensing region 110 of the optical transceiver 11. The RDL 12 may expose the sensing region 110 of the optical transceiver 11. The RDL 12 may have an opening to expose the sensing region 110.

The RDL 12 may include one or more dielectric layers. In some embodiments, the RDL 12 includes the dielectric layers 12d1, 12d2, and 12d3. The dielectric layer 12d1 is disposed on the dielectric layer 12d2. The dielectric layer 12d2 may be disposed on the dielectric layer 12d3. The dielectric layer 12d3 may be disposed on the optical transceiver 11. In some embodiments, the dielectric layer 12d2 may be disposed between the dielectric layers 12d1 and 12d3. In some embodiments, the RDL 12 may further include traces 12c disposed within the RDL 12 (e.g., on the dielectric layer 12d2 or dielectric layer 12d3) or on the topmost dielectric layer 12d1. In some embodiments, the RDL 12 may include conductive vias penetrating one or more of the dielectric layers 12d1, 12d2, and 12d3, and electrically connected the corresponding traces. The RDL 12 can include one or more pads 12p disposed on the dielectric layer 12d1. The pads 12p can protrude from the top surface of the dielectric layer 12d1. In another embodiment, the pads 12p may be embedded in the dielectric layer 12d1 and the top surface of the pads 12p may be exposed from the dielectric layer 12d1. In some embodiments, the pads 12p may be connected to the substrate pads 101 through a conductive wire 16.

The dielectric layers 12d1, 12d2, and 12d3 may have a thickness in a range of 5 μm to 20 μm. The traces of the RDL 12 may have a thickness in a range of 1 μm to 20 μm. In some embodiments, the traces of the RDL 12 may have a seed layer 12s. The seed layer 12s may have a thickness in a range of 0.1 μm to 1 μm.

In some embodiments, the opening of the RDL 12 may taper toward the optical transceiver 11. Within the opening of the RDL 12, a lateral surface of the dielectric layer 12d1 may be recessed from a lateral surface of the dielectric layer 12d2. The lateral surface of the dielectric layer 12d2 may be recessed from a lateral surface of the dielectric layer 12d3. In some embodiments, the lateral surfaces of the dielectric layers 12d1, 12d2, and 12d3 (within the opening of the RDL 12) may be misaligned. In some embodiments, the lateral surfaces of the dielectric layers 12d1, 12d2, and 12d3 (within the opening of the RDL 12) form a stepped structure. In other embodiments, the lateral surfaces of the dielectric layers 12d1, 12d2, and 12d3 located at a side distal to the opening of the RDL 12 (for example, the leftmost or the rightmost lateral surfaces) may be aligned or coplanar with each other. In some embodiments, the lateral surfaces of the dielectric layers 12d1, 12d2, and 12d3 located at a side distal to the opening of the RDL 12 (for example, the leftmost or the rightmost lateral surface) may be aligned or coplanar with a lateral surface of the optical transceiver 11.

In some embodiments, the RDL 12 of the present disclosure may have fine lines (e.g. L/S<2 μm/2 μm), which provides the advantages, such as package miniaturization and low cost.

The electronic component 14 may be disposed on and electrically connected to the optical transceiver 11 through the RDL 12. The electronic component 14 can have a backside surface 141 and an active surface 142 opposite to the backside surface 141. The active surface 142 faces the optical transceiver 11. In some embodiments, the electronic component 14 can have pads protruding from the active surface 142. In another embodiments, the pads of the electronic component 14 may be embedded within the electronic component 14.

One or more micro-bumps 14b may be disposed on the pads of the electronic component 14. In some embodiments, micro-bumps 14b may be disposed between the electronic component 14 and the RDL 12, such that the electronic component 14 may be electrically connected to the RDL 12 through the micro-bumps 14b. The micro-bumps 14b can have a diameter in a range of 10 μm to 30 μm. In some embodiments, the micro-bumps 14b can have a pitch in a range of 15 μm to 60 μm.

The size of the electronic component 14 may be less than the optical transceiver 11. For example, the width of the electronic component 14 may be less than that of the optical transceiver 11. In some embodiments, the thickness of the electronic component 14 may be less than that of the optical transceiver 11. In another embodiments, the thickness of the electronic component 14 and the thickness of the optical transceiver 11 may be the same. In some embodiments, the electronic component 14 may be a chip or die. In some embodiments, the electronic component 14 may be an electrical integrated circuit (EIC).

In some embodiments, the underfill 14*u* may encapsulate the micro-bumps 14*b*. In some embodiments, the underfill 14*u* may be disposed between the electronic component 14 and the RDL 12. The underfill 14*u* may cover a part of the dielectric layer 12*d*1. The underfill 14*u* may cover a lateral surface of the electronic component 14. In some embodiments, the underfill 14*u* may cover the entire lateral surface of the electronic component 14. The underfill 14*u* is free from contact with the backside surface 141 of the electronic component 14. The underfill 14*u* may expose the backside 141 of the electronic component 14. The underfill 14*u* may have a lateral surface non-perpendicular to the backside surface 141 of the electronic component 14. In some embodiments, the underfill 14*u* may have an upper width adjacent to the backside surface 141 of the electronic component 14 and a lower width adjacent to the RDL 12. The upper width of the underfill 14*u* may be identical to the lower width of the underfill 14*u*. In another embodiment, the upper width of the underfill 14*u* may be different from the lower width of the underfill 14*u*. For example, the upper width of the underfill 14*u* may be less than the lower width of the underfill 14*u*.

The component 13 may be disposed on or over the optical transceiver 11. In some embodiments, the component 13 may be disposed between the optical transceiver 11 and the optical transceiver 17. In some embodiments, the component 13 may be disposed adjacent to the sensing region 110. In some embodiments, the RDL 12 may be disposed around the periphery of the sensing region 110 of the optical transceiver 11. In some embodiments, the component 13 may be embedded in the RDL 12. In some embodiments, the component 13 may be embedded in one or more of the dielectric layers 12*d*1, 12*d*2, and 12*d*3 of the RDL 12. In some embodiments, the component 13 may be viewed as a component independent from the RDL 12 or as a part of the RDL 12.

The component 13 may be configured to provide a magnetic field to change a light emitting direction from the optical transceiver 11 to the optical transceiver 17 or from the optical transceiver 17 to the optical transceiver 11. In some embodiments, the component 13 may be configured to regulate a direction of an optical signal toward or from the optical transceiver 11 or the optical transceiver 17, for example, by electrical current or magnetic field (e.g., magnetic field produced by electrical current). In some embodiments, the direction of the optical signal 21 may be regulated or adjusted by the component 13 based on magneto-optic effect and the direction of the optical signal 21 may be controlled. In the present disclosure, the component 13 may be referred to as "magnetic component" or "conductive component." In the present disclosure, the component 13 may be referred to as "signal path modulation component" or optical signal path modulation component."

Figure 1B:
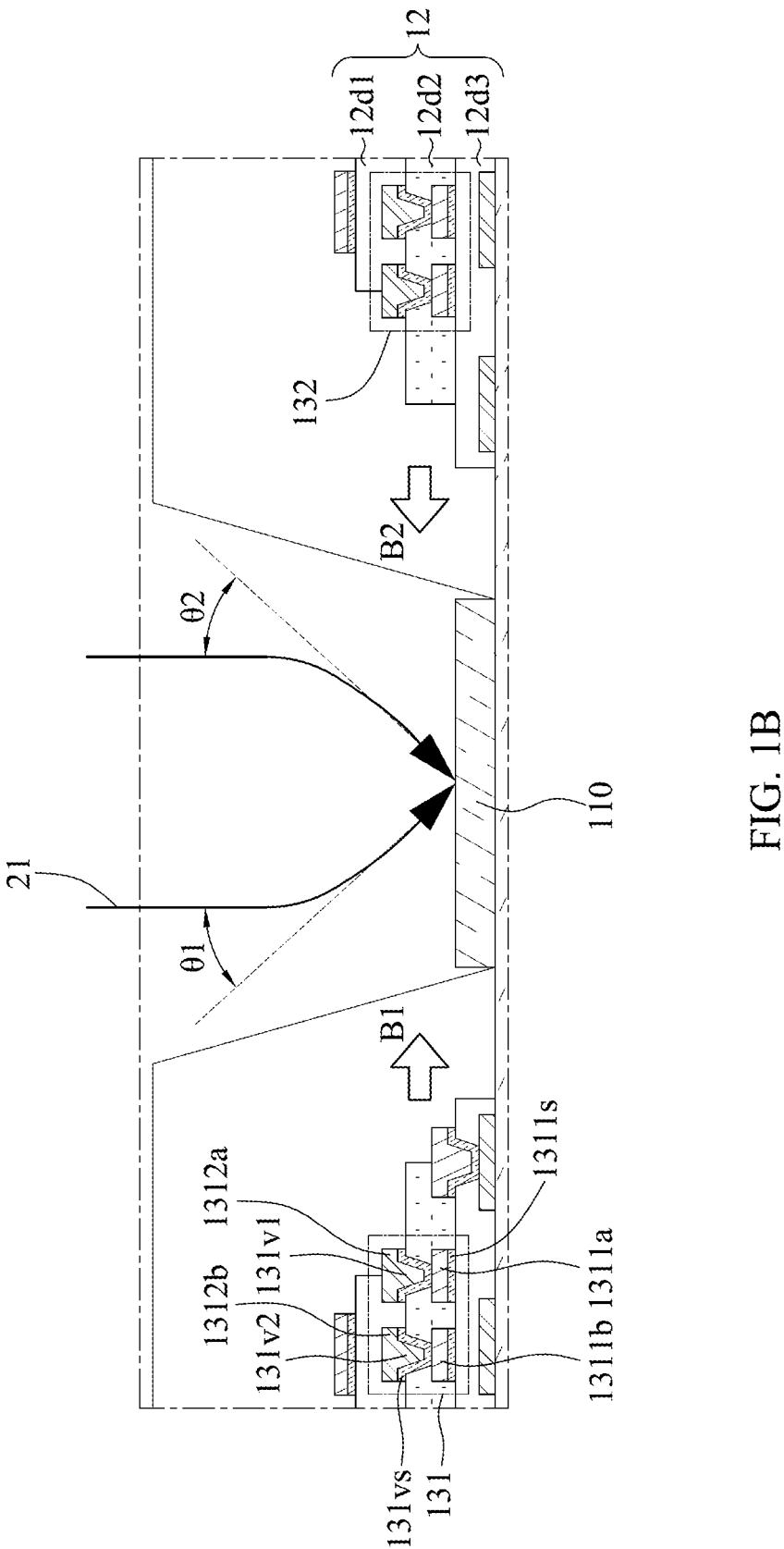
FIG. 1B is an enlarged perspective view of a region "A" in FIG. 1A.
Figure 1C:
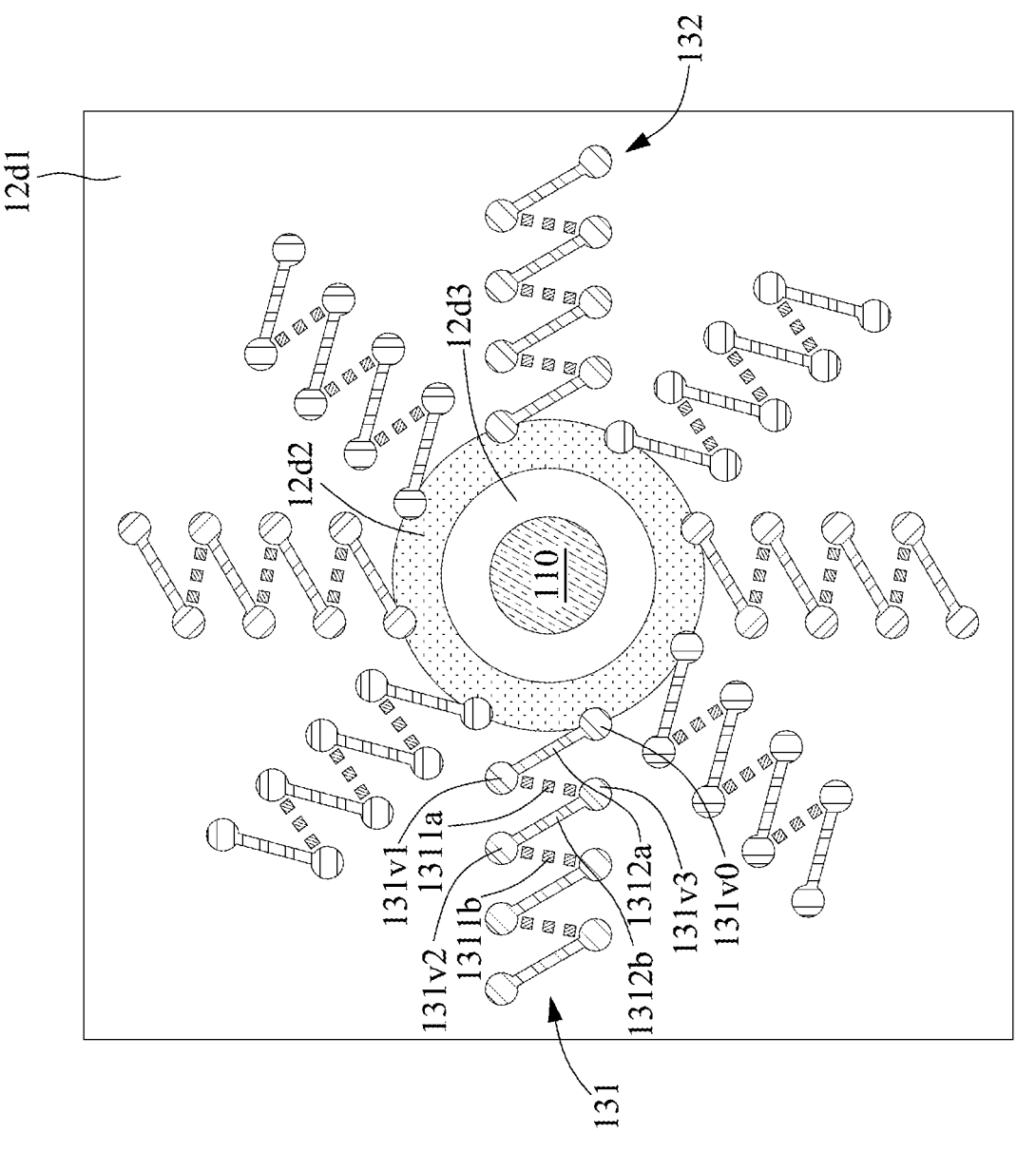
FIG. 1C is a top view of the region "A" in FIG. 1A.

The details of the component 13 are discussed below in view of FIG. 1A, FIG. 1B and FIG. 1C. FIG. 1B is an enlarged perspective view of a region "A" in FIG. 1A. FIG. 1C is a top view of the region "A" in FIG. 1A, from which the optical transceiver 17 and the encapsulant 15 are omitted for clarity.

Referring to FIG. 1B and FIG. 1C, the component 13 is around the sensing region 110. In some embodiments, the component 13 may be formed by a plurality of independent elements (may be referred to as "(optical) signal path modulation elements"), such as independent coils. The component 13 may include one or more coils (e.g., 131 and 132) disposed around or surrounding the sensing region 110. The number of the coils is not limited. For example, the component 13 may include one, two, three, four, five, six, seven, eight, nine, ten, or more coils. The coils of the component 13 may be arranged symmetrically with respect to the sensing region 110. In some embodiments, the component 13 can include one or more pairs of coils disposed opposite with regard to the sensing region 110. For example, the coil 131 may be disposed adjacent to a first side (for example, left side) of the sensing region 110, and the coil 132 may be disposed adjacent to a second side (for example, right side) of the sensing region 110 opposite to the first side. In some embodiments, the coils 131 and 132 may be embedded in the dielectric layers 12*d*1 and 12*d*2 of the RDL 12. The coils 131 and 132 may be partially exposed from the dielectric layers 12*d*1 and 12*d*2 of the RDL 12. The coils 131 and 132 may be covered by the encapsulant 15.

The coil 131 may include lower traces 1311*a* and 1311*b*, upper traces 1312*a* and 1312*b*, vias 131*v*0, 131*v*1, 131*v*2, and 131*v*3. The lower traces 1311*a* and 1311*b* may be disposed on the dielectric layer 12*d*3 (as shown in FIG. 1B). That is, the lower traces 1311*a* and 1311*b* may be embedded in the dielectric layer 12*d*2. The upper traces 1312*a* and 1312*b* may be disposed on the dielectric layer 12*d*2 (as shown in FIG. 1B). That is, the upper traces 1312*a* and 1312*b* may be embedded in the dielectric layer 12*d*1. The dielectric layer 12*d*1 can cover the upper traces 1312*a* and 1312*b*, while the dielectric layer 12*d*1 is shown transparent in FIG. 1C for clarity.

In some embodiments, the lower traces 1311*a* and 1311*b* may be formed on the dielectric layer 12*d*3 through a trace seed layer 1311*s*. The trace seed layer 1311*s* can have a thickness in a range of 0.1 μm to 1 μm. In some embodiments, the lower trace 1311*a* may be spaced apart from the lower trace 1311*b*. The lower trace 1311*a* and the lower trace 1311*b* may be spaced apart from each other by the dielectric layer 12*d*2.

The upper trace 1312*a* may be disposed above the lower trace 1311*a*. The upper trace 1312*a* and the lower trace 1311*a* may be spaced apart from each other by the dielectric layer 12*d*2. The upper trace 1312*b* may be disposed above the lower traces 1311*a* and 1311*b*. The upper trace 1312*b* may be spaced apart from the lower traces 1311*a* and 1311*b* by the dielectric layer 12*d*2. In some embodiments, the upper traces 1312*a* and 1312*b* may extend in parallel to each other. The lower traces 1311*a* and 1311*b* may extend in parallel to each other. A projection of the lower trace 1311*a* on the dielectric layer 12*d*3 can partially overlap with a projection of the upper trace 1312*a* on the dielectric layer 12*d*3.

The vias 131*v*0, 131*v*1, 131*v*2, and 131*v*3 may penetrate the dielectric layer 12*d*2 so as to connect the upper traces to the lower traces. The via 131*v*0 may be connected to the upper trace 1312*a*. The via 131*v*1 is disposed on the lower trace 1311*a* and connect the upper trace 1312*a* to the lower trace 1311*a*. In some embodiments, the via 131*v*1 may extend from the upper trace 1312*a* to the lower trace 1311*a*. The via 131*v*3 is disposed on the lower trace 1311*a* and connect the upper trace 1312*b* to the lower trace 1311*a*. In some embodiments, the via 131*v*3 may extend from the upper trace 1312*b* to the lower trace 1311*a*. The via 131*v*2 is disposed on the lower trace 1311*b* and connect the upper trace 1312*b* to the lower trace 1311*b*. In some embodiments, the via 131*v*2 may extend from the upper trace 1312*b* to the lower trace 1311*b*.

The vias 131*v*0, 131*v*1, 131*v*2, and 131*v*3 may formed on the lower traces through a seed layer. For example, as shown in FIG. 1B, the vias 131*v*1 and 131*v*2 may be formed on the lower traces 1311*a* and 1311*b*, respectively, through a seed layer 131*vs*. The seed layer 131*vs* may have a thickness in a range of 0.1 µm to 1 µm. The vias 131*v*0, 131*v*1, 131*v*2, and 131*v*3 may taper toward the lower traces. For example, the via 131*v*1 may taper toward the lower trace 1311*a*. The via 131*v*2 may taper toward the lower trace 1311*b*.

In some embodiments, a conductive path may be established through the vias, the lower traces and the upper traces for forming the coils. For example, as illustrated in FIG. 1C, a conductive path may be established through the via 131*v*0, the upper trace 1312*a*, the via 131*v*1, the lower trace 1311*a*, the via 131*v*3, and the upper trace 1312*b*, the via 131*v*2, and the lower trace 1311*b* for forming the coil 131. The coil 131 can provide a magnetic field toward or away from the sensing region 110 when electrical current passes through the coil 131. In some embodiments, the coils 131 and 132 are isolated from other traces or conductive elements, for example, those electrically connecting the electronic component 14 to the optical transceiver 11.

Similar to the coil 131, a conductive path may be established through the vias, the lower traces and the upper traces for forming the coil 132. The coil 132 can provide a magnetic field toward or away from the sensing region 110 when electrical current passes through the coil 132. In some embodiments, a direction of the magnetic field provide by the coil 131 is opposite to a direction of the magnetic field provide by the coil 132.

In some embodiments, the component 13 (e.g., the coils) are configured to provide a magnetic field. In some embodiments, the coils are configured to provide magnetic field toward or away from the sensing region 110 when electrical current passes through the coils. For example, as illustrated in FIG. 1B, when electrical current passes through, the coils 131 and 132 produce magnetic fields (or magnetic forces) B1 and B2 toward the sensing region 110, respectively. The direction of optical signals 21 may be changed or regulated by the magnetic fields B1 and/or B2 due to the magneto-optic effect. The optical signal(s) near the coil 131 would be affected by the magnetic field B1 more than the magnetic field B2 and may deviate from its original incident direction by an angle of $\theta_1$. The optical signal(s) near the coil 132 would be affected by the magnetic field B2 more than the magnetic field B1 and may deviate from its original incident direction by an angle of $\theta_2$. As a result, the optical signals can be concentrated and enter a smaller area of the sensing region 110. The angle of $\theta_1$, $\theta_2$, etc., may be referred to as the angle of incidence.

The magnitude of magnetic fields (or magnetic forces) B1 and B2 may be adjusted by the electrical current (I) passing through the coils 131 and 132 and the diameter (d) of the coils 131 and 132. The magnitude of magnetic fields B1 and B2 may be proportional to the electrical current (I) passing through the coils. That is, the magnitude of magnetic fields B1 and B2 increases with electrical current through the coils 131 and 132. In another embodiment, the magnitude of magnetic fields B1 and B2 increases as diameter of the coils 131 and 132 is reduced. In some embodiments, the magnetic fields B1 and B2 can control the angle of incidence ($\theta$) and the direction of the optical signal 21, e.g., using an algorithm. Accordingly, by controlling the electrical current(s)

applied to the coil(s) and its magnitude, the direction and magnitude of the corresponding magnetic field(s) can be easily controlled to adjust the direction of the optical signal (s). e.g., to concentrate the optical signal(s). As a result, the required sensing area of the sensing region 110 can be reduced and the effectiveness and performance of the semiconductor device 1 can be increased. With more coils arranged in the semiconductor device 1, the direction of the optical signals 21 toward or from the sensing region 110 may be controlled much more accurately.

Figure 1D:
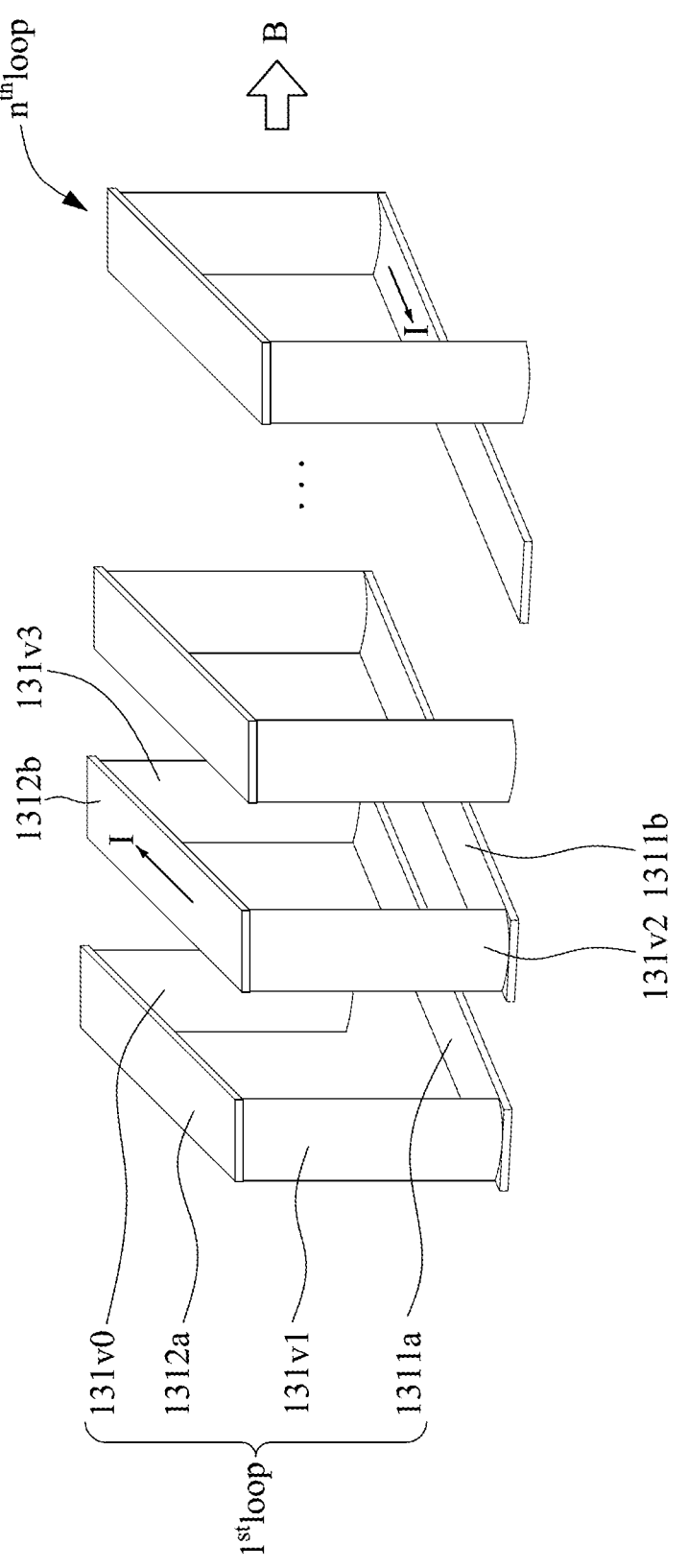
FIG. 1D is a perspective view of a coil according to some embodiments of the present disclosure.

FIG. 1D is a perspective view of a coil 131' according to some embodiments of the present disclosure. The coil 131' in FIG. 1D may be an example of the coil 131 in FIG. 1A, FIG. 1B, and FIG. 1C. The coil 131' may include one or more loops. Referring to FIG. 1D, the first loop of the coil 131' may include the lower trace 1311*a*, the upper trace 1312*a*, vias 131*v*0 and 131*v*1. In some embodiments, the upper trace 1312*a* may be disposed above the lower trace 1311*a*. The via 131*v*0 may be connected to the upper trace 1312*a*. The lower trace 1311*a* and the upper trace 1312*a* may be electrically connected through the via 131*v*1. The second loop of the coil 131' may include the upper trace 1312*b*, the lower trace 1311*b*, and vias 131*v*2 and 131*v*3. In some embodiments, the upper trace 1312*b* may be disposed above the lower traces 1311*a* and 1311*b*. The lower trace 1311*a* and the upper trace 1312*b* may be electrically connected through the via 131*v*3. The lower trace 1311*b* and the upper trace 1312*b* may be electrically connected through the via 131*v*2.

Referring back to FIG. 1A, the encapsulant 15 may cover the optical transceiver 11 and expose the sensing region 110. The encapsulant 15 has a first surface 151 (e.g., the top surface), a second surface 152 (e.g., an interface between the encapsulant 15 and the optical transceiver 11) opposite to the first surface 151, and a third surface 153 (e.g., the bottom surface) opposite to the first surface 151. The second surface 152 of the encapsulant 15 may be coplanar with the second surface 112 of the optical transceiver 11. In some embodiments, the encapsulant 15 may have a thickness from the first surface 151 to the third surface 153 in a range of 50 µm to 500 µm.

The encapsulant 15 may cover the top surface 10*b* of the substrate 10. In some embodiments, the encapsulant 15 may have a lateral surface aligned with a lateral surface of the substrate 10. The encapsulant 15 may encapsulate the optical transceiver 11, the RDL 12, and the electronic component 14. In some embodiments, the encapsulant 15 may cover the component 13 and in such embodiments, the encapsulant 15 may be transparent or can allow the light within specific wavelength range to pass through.

In the some embodiments according to the present disclosure, the encapsulant 15 may protect all devices included in the semiconductor device 1 except the optical transceiver 17 and forms a cavity with a sloped lateral surface for collecting the optical signals.

The encapsulant 15 may have an opening 19 penetrating from the first surface 151 to the second surface 152. In some embodiments, the opening 19 may expose the optical transceiver 11. For example, the opening 19 may expose the sensing region 110. The opening 19 of the encapsulant 15 can taper from the first surface 151 to the second surface 152 of the encapsulant 15. The opening 19 may have a first width (or diameter) W1 adjacent to the first surface 151 and a second width (or diameter) W2 adjacent to the second surface 152, and the first width (or diameter) W1 is greater than the second width (or diameter) W2. In some embodiments, the second width (or diameter) W2 may be substantially identical to or greater than the width (or diameter) of the sensing region 110 of the optical transceiver 11.

The optical transceiver 17 may be disposed on or over the first surface 151 of the encapsulant 15. In some embodiment, the optical transceiver 17 may be disposed on the first surface 151 of the encapsulant 15 through an adhesive 17a. In some embodiments, the optical transceiver 17 may be an optical transmitting element. For example, the optical transceiver 17 may be a fiber array unit (FAU), which may include a plurality of optical fibers.

In some embodiments, the encapsulant 15 may define a light channel (e.g., the opening 19) between the optical transceiver 17 and the optical transceiver 11. The light channel 19 has a first end adjacent to the optical transceiver 17 and a second end opposite to the first end and adjacent to the optical transceiver 11. In some embodiments, the second end of the light channel 19 is adjacent to the sensing region 110. The second end can have a width (or diameter) W2 less than a width (or diameter) W1 of the first end.

The external connectors (e.g., solder balls) 18 may be formed on and be electrically connected to the substrate 10 for external electrical connection. In some embodiments, the external connecters 18 may be disposed on the bottom surface 10a of the substrate 10 through pads 18p. In some embodiments, the pads 18p may have a seed layer 18s formed between the pads 18p and the bottom surface 10a of the substrate 10. In some embodiments, the electronic component 14 and the optical transceiver 11 may be electrically connected to external circuit or element(s) through the RDL 12 (e.g., the pads 12p of the RDL 12), the conductive wires 16, the substrate 10, and the external connectors 18. The external connectors 18 may have a diameter in a range of 30 μm to 200 μm and a pitch in a range of 50 μm to 400 μm.

In the existing techniques, the optical sensors may require a large sensing area to collect as many optical signals as possible, which increases the size of the optical sensors as well as the size of the semiconductor device equipped with the optical sensor. In the present disclosure a signal path modulation component is provided such that the direction of the optical signals toward or from the optical sensor (or the optical transceiver 11) may be adjusted by the magnetic field produced by the signal path modulation component based on magneto-optic effect. The signal path modulation component (such as coils) can provide magnet field to adjust or regulate the direction of the optical signals. Therefore, the optical signals may be obtained or collected within a smaller space as the optical signals may travel along a direction perpendicular to the sensing region of the optical sensor and then deviate from such direction in response to the magnet field to form a concentrated light beam when they are close to the sensing region of the optical sensor.

The magnetic fields of the signal path modulation component (such as coils) included in the RDL may modify the angle of incidence and the direction of the optical signals. To control the magnetic fields, the electrical current passing through the signal path modulation component may be controlled, e.g., using an algorithm, so that the angle of incidence and the direction of the optical signals may be adjusted accurately. Accordingly, the effectiveness and performance of the optical sensor may be improved. Having the signal path modulation component, the opening for transmitting the optical signals and the area of the sensing region of the optical sensor may be reduced, and thus the size (for example, the width and the thickness) of the semiconductor device may be reduced.

In some embodiments, the semiconductor device 1 includes an optical transceiver 11 having a sensing region

110; a redistribution structure 12 disposed on the optical transceiver 11 and defining an opening exposing the sensing region 110 of the optical transceiver 11, an electronic component 14 disposed on the redistribution structure 12. The redistribution structure 12 includes a first path (for example, an electrical path) for electrically connecting the electronic component 14 with the optical transceiver 11 and a second path for regulating a direction of an optical signal 21 toward or from the optical transceiver 11. In some embodiments, the second path is in the form of a coil (e.g., 131 or 132) and is an electrical path. In some embodiments, the redistribution structure is multilayered. In some embodiments, the redistribution structure includes a first dielectric layer 12d3, a plurality of first traces (e.g., 1311a, 1311b) on the first dielectric layer 12d3, a second dielectric layer 12d2 on the first dielectric layer 12d3 and covering the plurality of first traces, a plurality of second traces (e.g., 1312a, 1312b) on the second dielectric layer 12d2, and a plurality of conductive vias penetrating the second dielectric layer. The plurality of first traces and the plurality of second traces are connected by the plurality of conductive vias to form the coil (e.g., 131 or 132).

Figure 2:
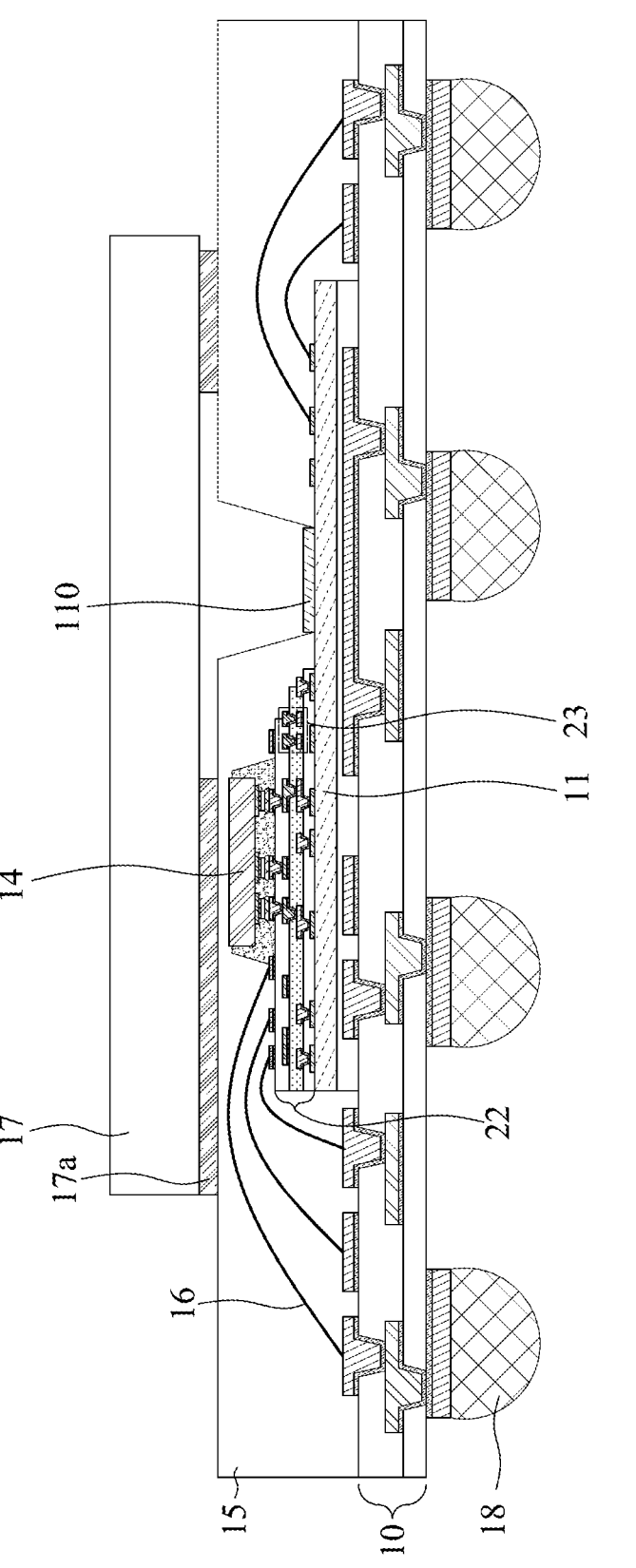
FIG. 2 is a cross-sectional view of a semiconductor device according to some embodiments of the present disclosure.

FIG. 2 is a cross-sectional view of a semiconductor device 2 according to some embodiments of the present disclosure. The semiconductor device 2 of FIG. 2 is similar to the semiconductor device 1 of FIG. 1A, except that the RDL 22 of the semiconductor device 2 of FIG. 2 may be disposed at only one side (for example, the left side) of the sensing region 110. Referring to FIG. 2, the semiconductor device 2 may include a signal path modulation component 23 disposed adjacent to the sensing region 110 of the optical transceiver 11. In some embodiments, the signal path modulation component 23 may be embedded in the RDL 22. As the RDL 22 is disposed at the left side of the sensing region 110, the signal path modulation component 23 is disposed at the left side of the sensing region 110 correspondingly.

Figure 3A:
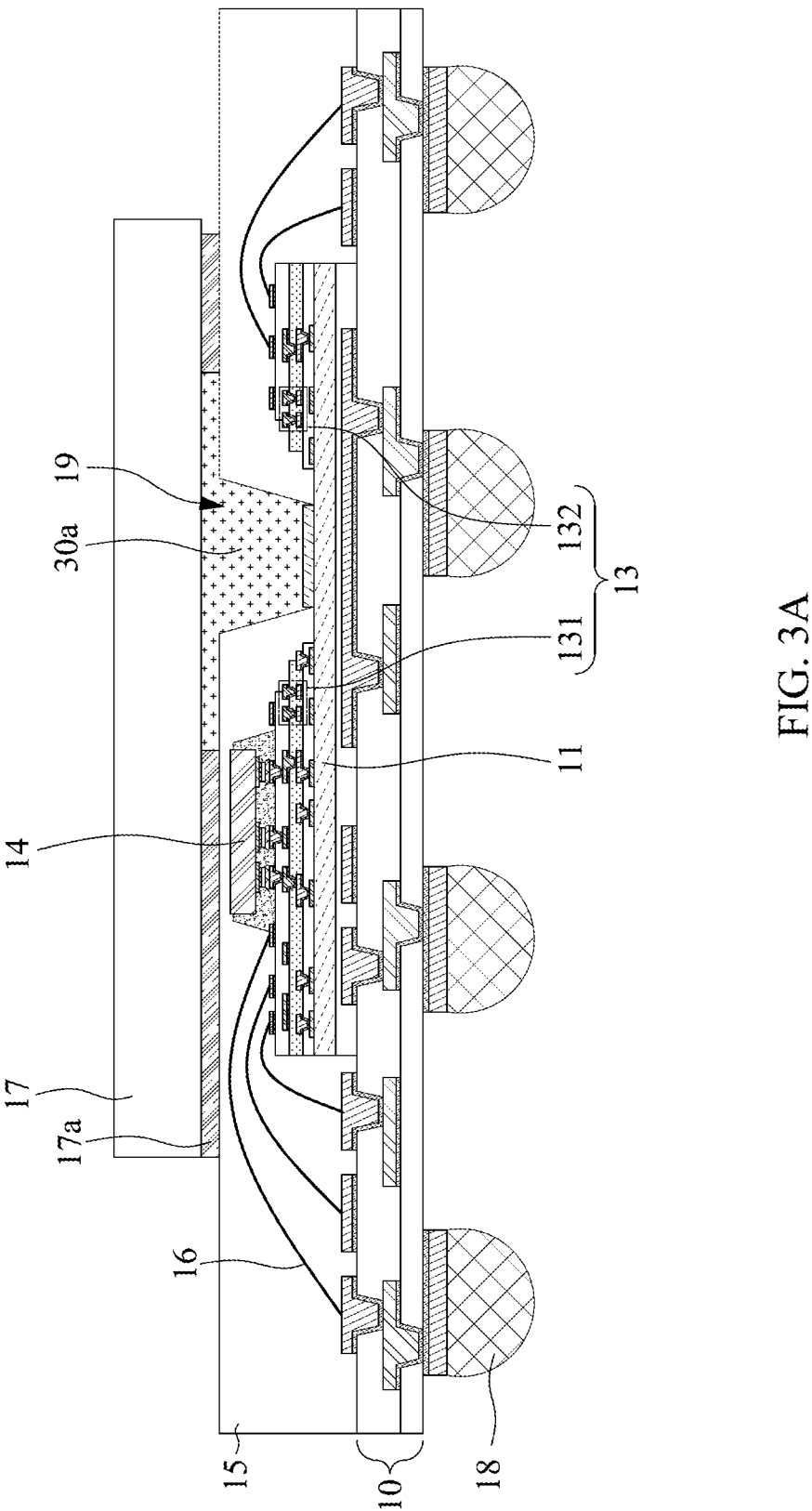
FIG. 3A is a cross-sectional view of a semiconductor device according to some embodiments of the present disclosure.

FIG. 3A is a cross-sectional view of a semiconductor device 3a according to some embodiments of the present disclosure. The semiconductor device 3a of FIG. 3A is similar to the semiconductor device 1 of FIG. 1A, except that the semiconductor device 3a of FIG. 3A further includes a filling medium 30a. In some embodiments, the filling medium 30a may be filled within the opening 19 of the encapsulant 15 and covers the sensing region 110 exposed from the opening 19 of the encapsulant 15. The filling medium 30a may be disposed between the optical transceiver 17 and the sensing region 110. In some embodiments, the filling medium 30a may have a top surface in contact with the optical transceiver 17. The filling medium 30a may cover a lateral surface of the encapsulant 15 within the opening 19.

In some embodiments, the filling medium 30a extends from the first surface 151 to the second surface 152 of the encapsulant 15. The filling medium 30a may have a first width or diameter (e.g., W1 in FIG. 1A) adjacent to the first surface 151 of the encapsulant 15 and a second width or diameter (e.g., W2 in FIG. 1A) adjacent to the sensing region 110. The first width or diameter of the filling medium 30a is greater than the second width or diameter of the filling medium 30a. In some embodiments, the filling medium 30a may be transparent or can allow the light within specific wavelength range to pass through. In some embodiments, the filling medium 30a may be or include a light guide material.

Figure 3B:
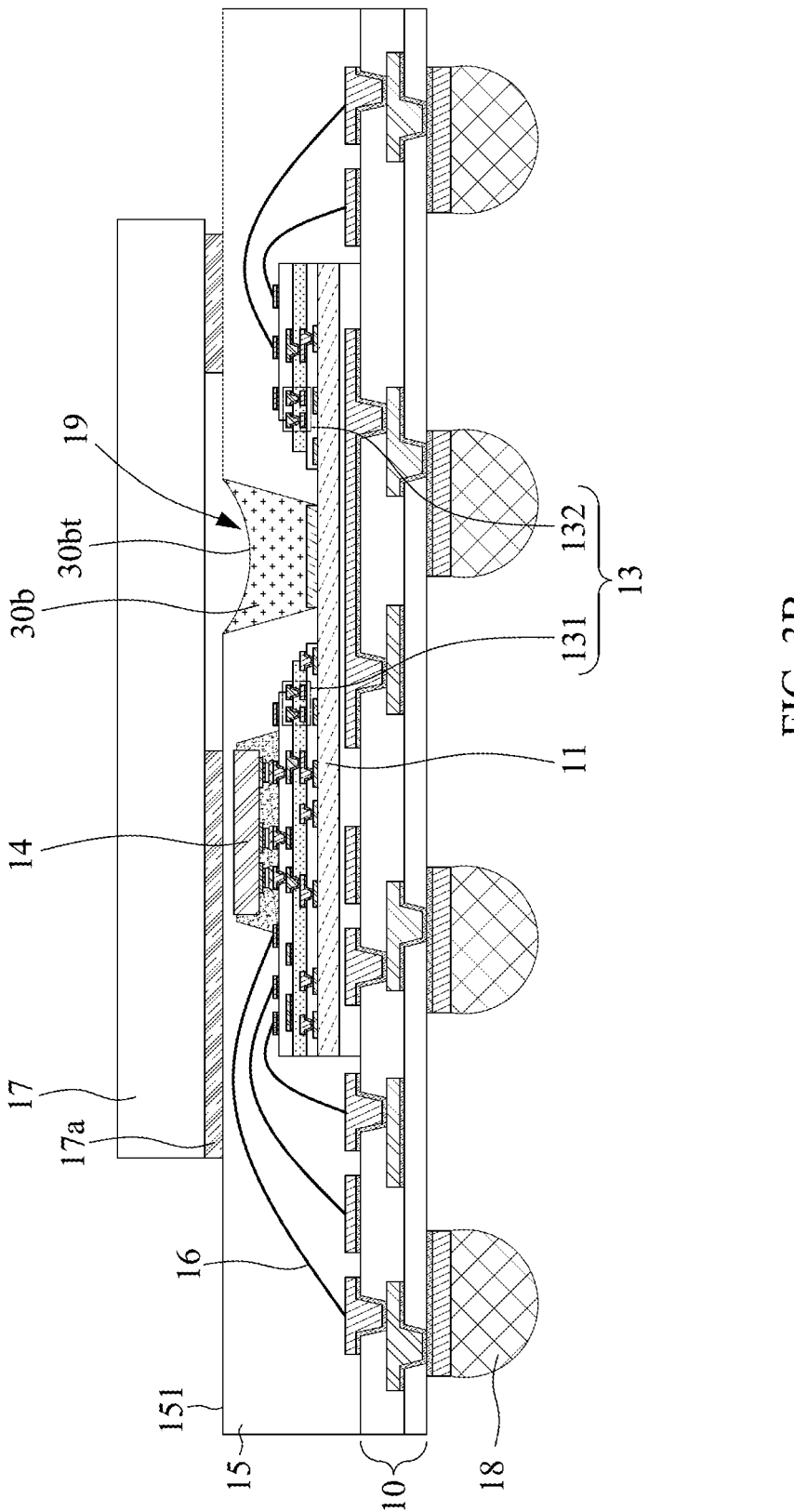
FIG. 3B is a cross-sectional view of a semiconductor device according to some embodiments of the present disclosure.

FIG. 3B is a cross-sectional view of a semiconductor device 3b according to some embodiments of the present disclosure. The semiconductor device 3b of FIG. 3B is similar to the semiconductor device 3a of FIG. 3A, except that a filling medium 30b of the semiconductor device 3b of FIG. 3B has a concave surface 30bt (e.g., the top surface of the filling medium 30b) facing away from the sensing region 110. In some embodiments, the filling medium 30b is free from contacting the optical transceiver 17 and the adhesive 17a. The concave surface 30bt of filling medium 30b can have an edge contacting the first surface 151 of the encapsulant 15. In some embodiments, the filling medium 30b may be free from contacting the first surface 151 of the encapsulant 15. In some embodiments, having the concave surface 30bt, the optical signals from the sensing region 110 may be focused and transmitted to the optical transceiver 17.

Figure 3C:
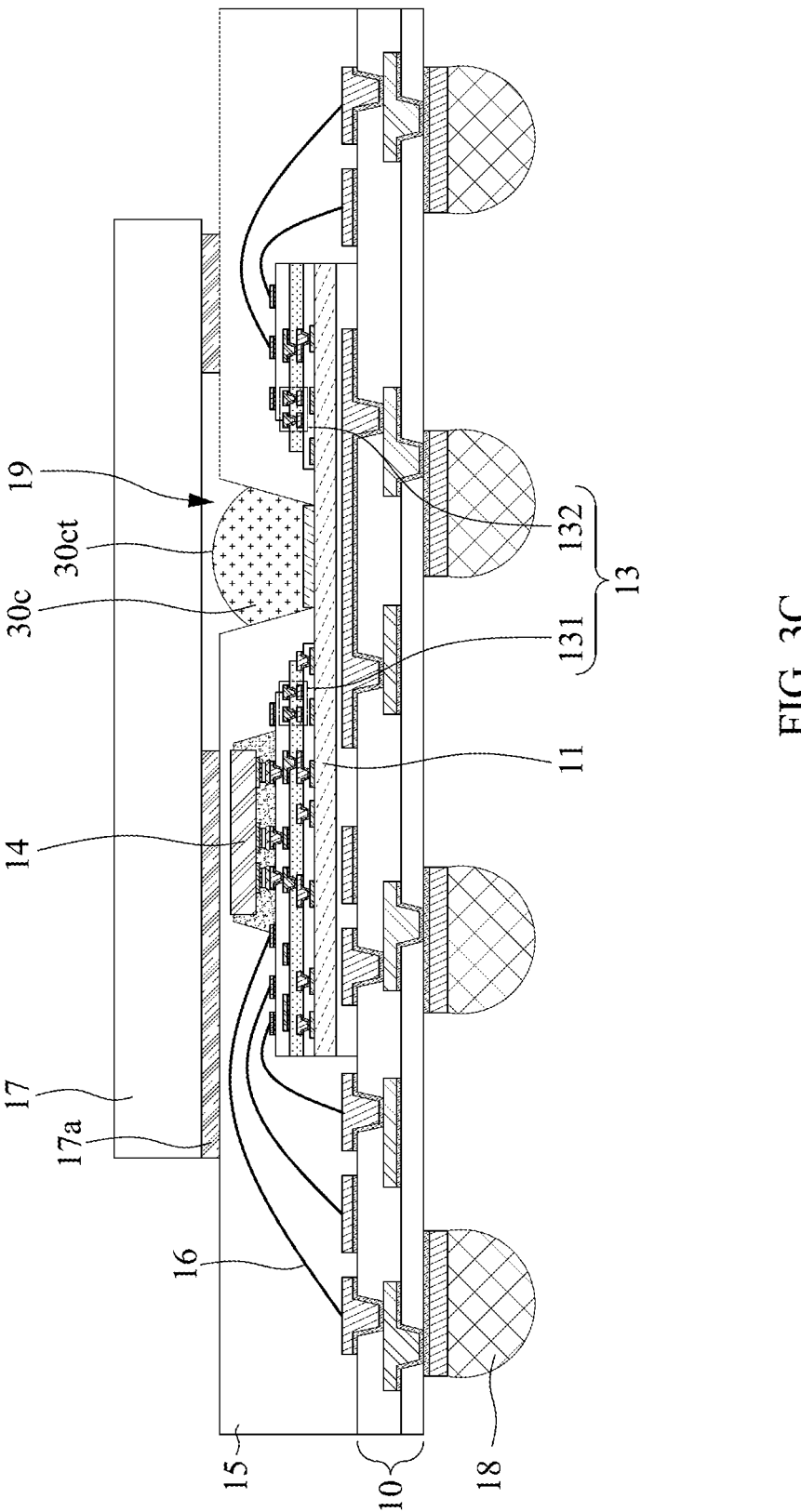
FIG. 3C is a cross-sectional view of a semiconductor device according to some embodiments of the present disclosure.

FIG. 3C is a cross-sectional view of a semiconductor device 3c according to some embodiments of the present disclosure. The semiconductor device 3c of FIG. 3C is similar to the semiconductor device 3a of FIG. 3A, except that a filling medium 30c of the semiconductor device 3c of FIG. 3C has a convex surface 30ct (e.g., the top surface of the filling medium 30c) facing away from the sensing region 110. In some embodiments, the filling medium 30c is free from contacting the optical transceiver 17 and the adhesive 17a. In some embodiments, the filling medium 30c may be free from contacting the first surface 151 of the encapsulant 15. Having the concave surface 30ct, the optical signals toward the sensing region 110 may be focused and transmitted to the sensing region 110. In another embodiment, with the concave surface 30ct, the optical signals from the sensing region 110 may be dispersed and transmitted to the optical transceiver 17.

Figure 4:
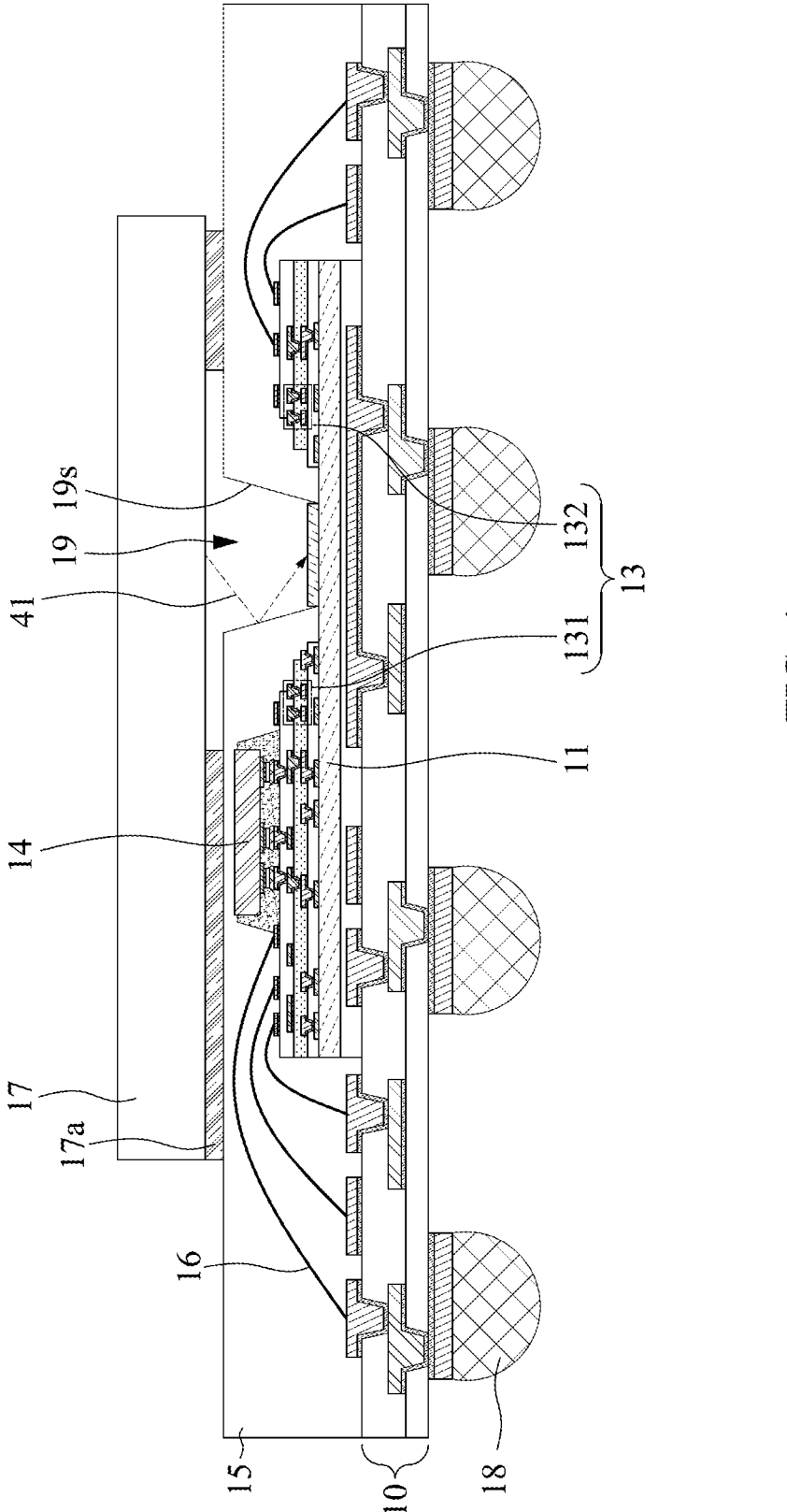
FIG. 4 is a cross-sectional view of a semiconductor device according to some embodiments of the present disclosure.

FIG. 4 is a cross-sectional view of a semiconductor device 4 according to some embodiments of the present disclosure. The semiconductor device 4 of FIG. 4 is similar to the semiconductor device 1 of FIG. 1A, except that the opening 19 of the semiconductor device 4 of FIG. 4 includes a lateral surface 19s configured to reflect the optical signal 41. In some embodiments, the lateral surface 19s of the opening 19 of the encapsulant 15 may made of a reflective material or have a reflective film formed thereon so as to reflect the optical signal 41. Accordingly, the light reaches the lateral surface 19s can be reflected by the lateral surface 19s and re-directed to the sensing region 110.

Figure 5A:
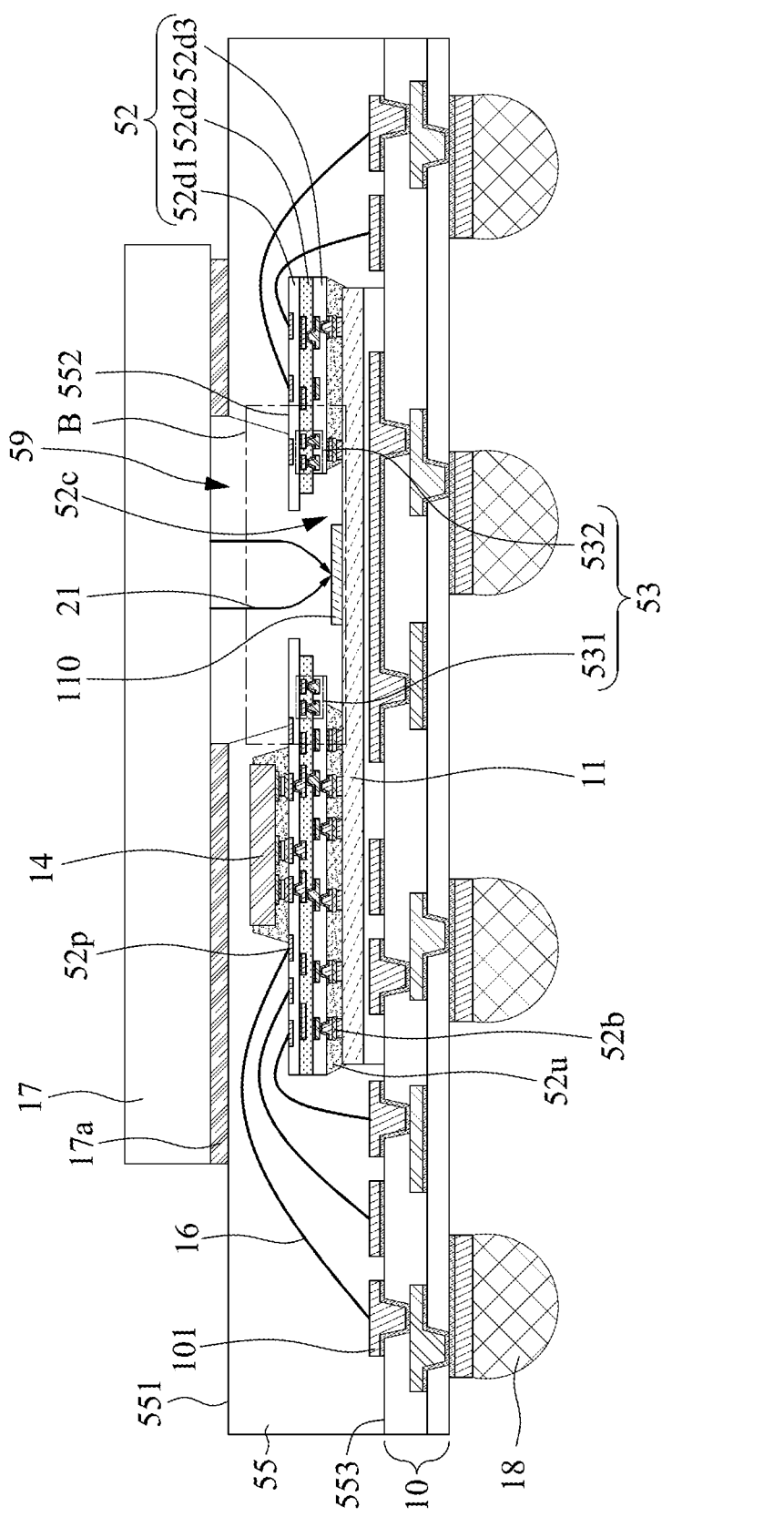
FIG. 5A is a cross-sectional view of a semiconductor device according to some embodiments of the present disclosure.

FIG. 5A is a cross-sectional view of a semiconductor device 5 according to some embodiments of the present disclosure. The semiconductor device 5 of FIG. 5A is similar to the semiconductor device 1 of FIG. 1A, except that the semiconductor device 5 of FIG. 5A includes a RDL 52 in a different arrangement. In some embodiments, the RDL 52 is formed and then attached to the optical transceiver 11. The RDL 52 may be an upside-down arrangement of the RDL 12.

The RDL 52 may be disposed adjacent to the sensing region 110 of the optical transceiver 11. The RDL 52 may expose the sensing region 110 of the optical transceiver 11. The RDL 52 may have an opening 52c (or cavity) to expose the sensing region 110.

In some embodiments, the RDL 52 may include dielectric layers 52d1, 52d2, and 52d3. The dielectric layer 52d1 is disposed on the dielectric layer 52d2. The dielectric layer 52d2 may be disposed on the dielectric layer 52d3. The dielectric layer 52d3 may be disposed on the optical transceiver 11. In some embodiments, the dielectric layer 52d2 may be disposed between the dielectric layers 52d1 and 52d3. Similar to the RDL 12, the RDL 52 may further include traces, conductive vias and pads (e.g., 52p) disposed on or within the RDL 52. In some embodiments, the pads 52p may be connected to the substrate pads 101 through the conductive wire 16.

In some embodiments, the opening 52c of the RDL 52 can taper toward the optical transceiver 17. In some embodiments, the opening 52c may have a stepped lateral surface as illustrated in FIG. 5A and the lateral surface of the opening 52c may be constituted by the lateral surfaces of the dielectric layers 52d1, 52d2, and 52d3. Within the opening 52c of the RDL 52, a lateral surface of the dielectric layer 52d3 may be recessed from a lateral surface of the dielectric layer 52d2. The lateral surface of the dielectric layer 52d2 may be recessed from a lateral surface of the dielectric layer 52d1. In some embodiments, the lateral surfaces of the dielectric layers 52d1, 52d2, and 52d3 (within the opening 52c of the RDL 52) may be misaligned.

In some embodiments, the RDL 52 may define a light channel (e.g., the opening 52c) between the optical transceiver 17 and the optical transceiver 11. The light channel (e.g., the opening 52c) has a first end and a second end opposite to the first end, where the second end is adjacent to the sensing region 110. In some embodiments, the second end of the light channel 52c may have a size (e.g., width or diameter) is larger than that of the first end of the light channel 52c.

The encapsulant 55 may encapsulate the optical transceiver 11 and expose the sensing region 110. The encapsulant 55 has a first surface 551 (e.g., the top surface), a second surface 552 (e.g., an interface between the encapsulant 55 and the RDL 52), and a third surface 553 (e.g., the bottom surface) opposite to the first surface 551. The second surface 552 of the encapsulant 55 may be coplanar with the top surface of the RDL 52.

The encapsulant 55 may cover the top surface 10b of the substrate 10. The encapsulant 55 may encapsulate the optical transceiver 11, the RDL 52, and the electronic component 14. In some embodiments, the encapsulant 55 may cover the component 53.

The encapsulant 55 may have an opening 59 penetrating from the first surface 551 to the second surface 552. In some embodiments, the opening 59 may expose the optical transceiver 11. For example, the opening 59 may expose the sensing region 110. In some embodiments, the opening 59 may expose the opening 52c of the RDL 52 and may further expose a portion of RDL 52 adjacent to the opening 52c. The opening 59 of the encapsulant 55 can taper from the first surface 551 to the second surface 552 of the encapsulant 55. The opening 59 may have a first width (or diameter) adjacent to the first surface 551 and a second width (or diameter) adjacent to the second surface 552. The first width (or diameter) of the opening 59 is greater than the second width (or diameter) of the opening 59. In some embodiments, the size (width or diameter) of the opening 59 of the encapsulant 55 is greater than the size (width or diameter) of the opening 52c of the RDL 52.

The component 53 has a function or structure the same as or similar to that of the component 13 and the details are as discussed hereinabove with respect to the component 13.

Similar to the component 13, the component 53 may be disposed over the optical transceiver 11 and adjacent to the sensing region 110. In some embodiments, the component 53 may be embedded in one or more of the dielectric layers 52d1, 52d2, and 52d3 of the RDL 52. The component 53 may include coils 531 and 532. The coil 531 may be disposed adjacent to a first side (for example, left side) of the sensing region 110. The coil 532 may be disposed adjacent to a second side (for example, right side) of the sensing region 110 opposite to the first side.

Figure 5B:
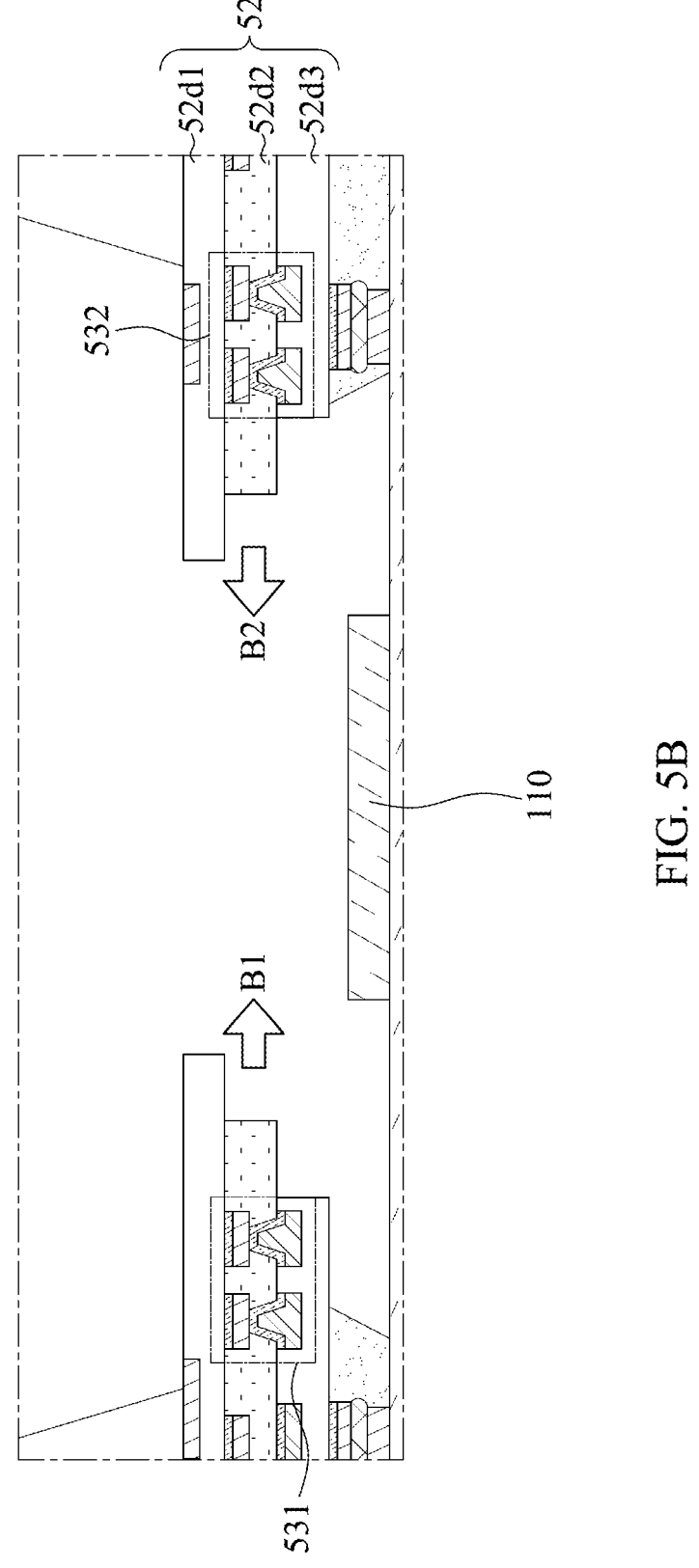
FIG. 5B is an enlarged perspective view of a region "B" in FIG. 5A.

FIG. 5B is an enlarged perspective view of a region "B" in FIG. 5A. Referring to FIG. 5B, the coils 531 and 532 may be similar to the coils 131 and 132 in FIG. 1B, except that the entire structure of the coils 531 and 532 are upside-down. As illustrated in FIG. 5B, the vias of the coils 531 and 532 may taper in a direction away from the sensing region 110.

The coil 531 may provide a magnetic field (or magnetic force) B1 toward (or away from) the sensing region 110 when electrical current passes through the coil 531. The coil 532 may provide a magnetic field (or magnetic force) B2 toward (or away) from the sensing region 110 when electrical current passes through the coil 532. In some embodiments, a direction of the magnetic field (or magnetic force) B1 is opposite to a direction of the magnetic field (or magnetic force) B2.

Figure 6A:
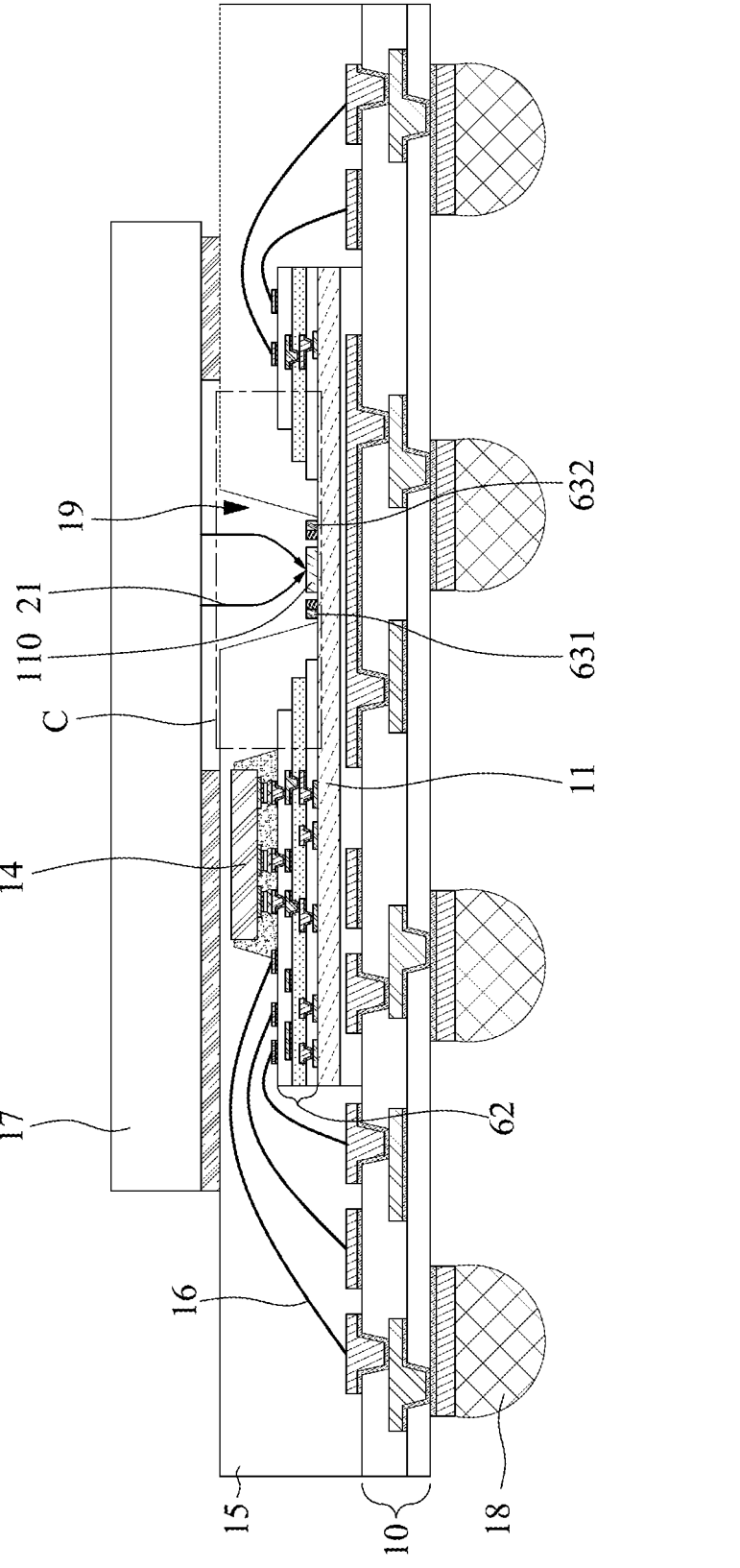
FIG. 6A is a cross-sectional view of a semiconductor device according to some embodiments of the present disclosure.

FIG. 6A is a cross-sectional view of a semiconductor device 6 according to some embodiments of the present disclosure. The semiconductor device 6 of FIG. 6A is similar to the semiconductor device 1 of FIG. 1A, except that the semiconductor device 6 of FIG. 6A includes one or more magnets (or magnetic material) 631 and 632. The magnets 631 and 632 may be disposed adjacent to the sensing region 110. The magnets 631 and 632 may be disposed on the optical transceiver 11. In some embodiments, the magnets 631 and 632 may be disposed within the opening 19. In another embodiment, the magnets 631 and 632 may be covered by or embedded in the encapsulant 15. The magnets 631 and 632 may include a material that produces a magnetic field. Unlike the component 13, the magnets 631 and 632 produce a magnetic field without electric current passing therethrough. In some embodiments, the magnets 631 and 632 can have distinct north and south magnetic poles.

Figure 6B:
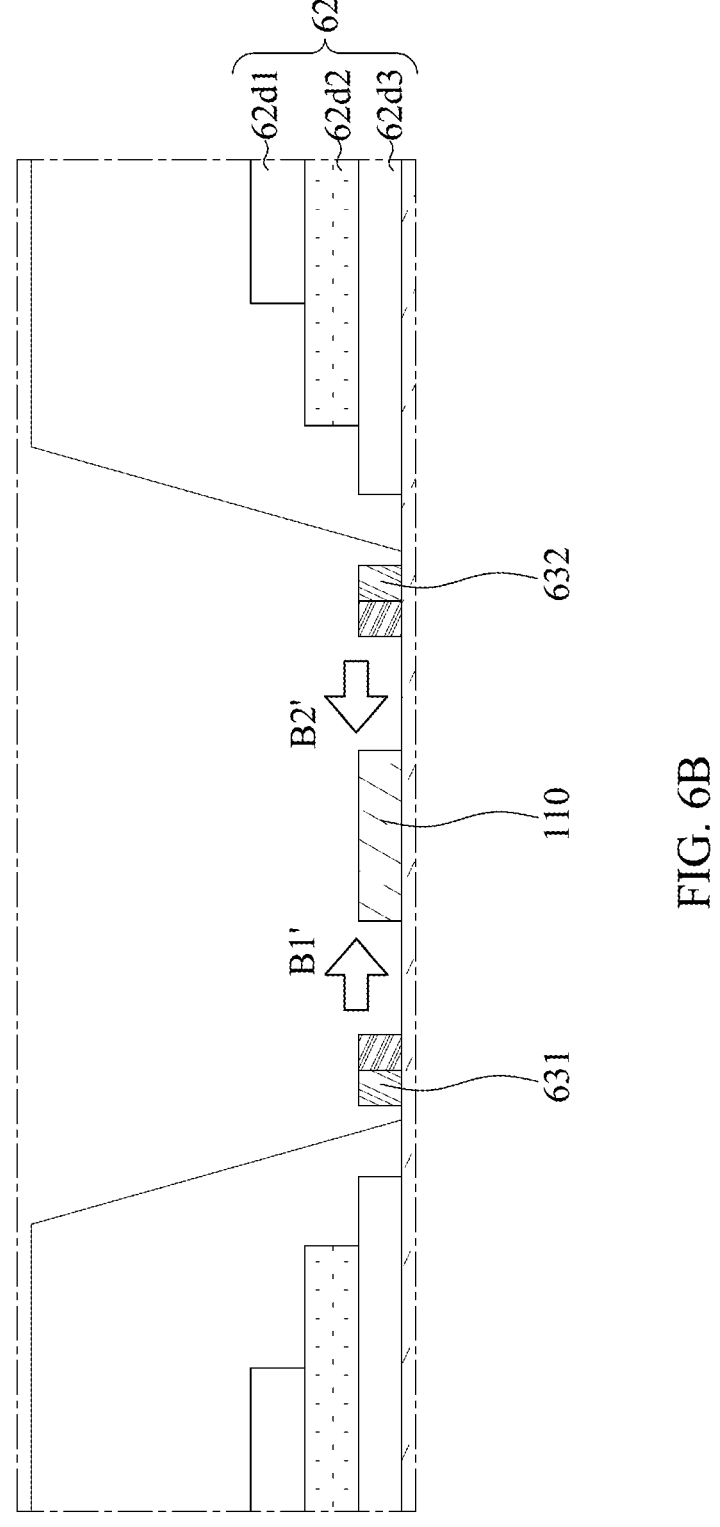
FIG. 6B is an enlarged perspective view of a region "C" in FIG. 6A.

FIG. 6B is an enlarged perspective view of a region "C" in FIG. 6A. Referring to FIG. 6B, the magnet 631 may be disposed on a first side (for example, left side) of the sensing region 110. The magnet 632 may be disposed on a second side (for example, right side) of the sensing region 110 opposite to the first side. The magnet 631 may provide a magnetic field B1' toward (or away from) the sensing region 110. The magnet 632 may provide a magnetic field B2' toward (or away from) the sensing region 110. In some embodiments, the magnetic field B1' *is* opposite to the magnetic force B2'.

Similar to the component 13, arranging the magnets 631 and 632 around the sensing region 110 can adjust the direction of the optical signals. In some embodiments, the optical signals can be concentrated before entering the sensing region 110 so that the area of the sensing region 110 can be reduced. Accordingly, the size of the semiconductor device 6 may be decreased.

In some embodiments, the semiconductor device 6 may include the magnet(s) 631 and 632 alone. In some embodiments, the semiconductor device 6 may include the component 13 (not shown in FIG. 6A) together with the magnet(s) 631 and 632; in such embodiments, the magnet(s) 631 and 632 can further enhance the strength of the magnetic field(s).

Figure 6C:
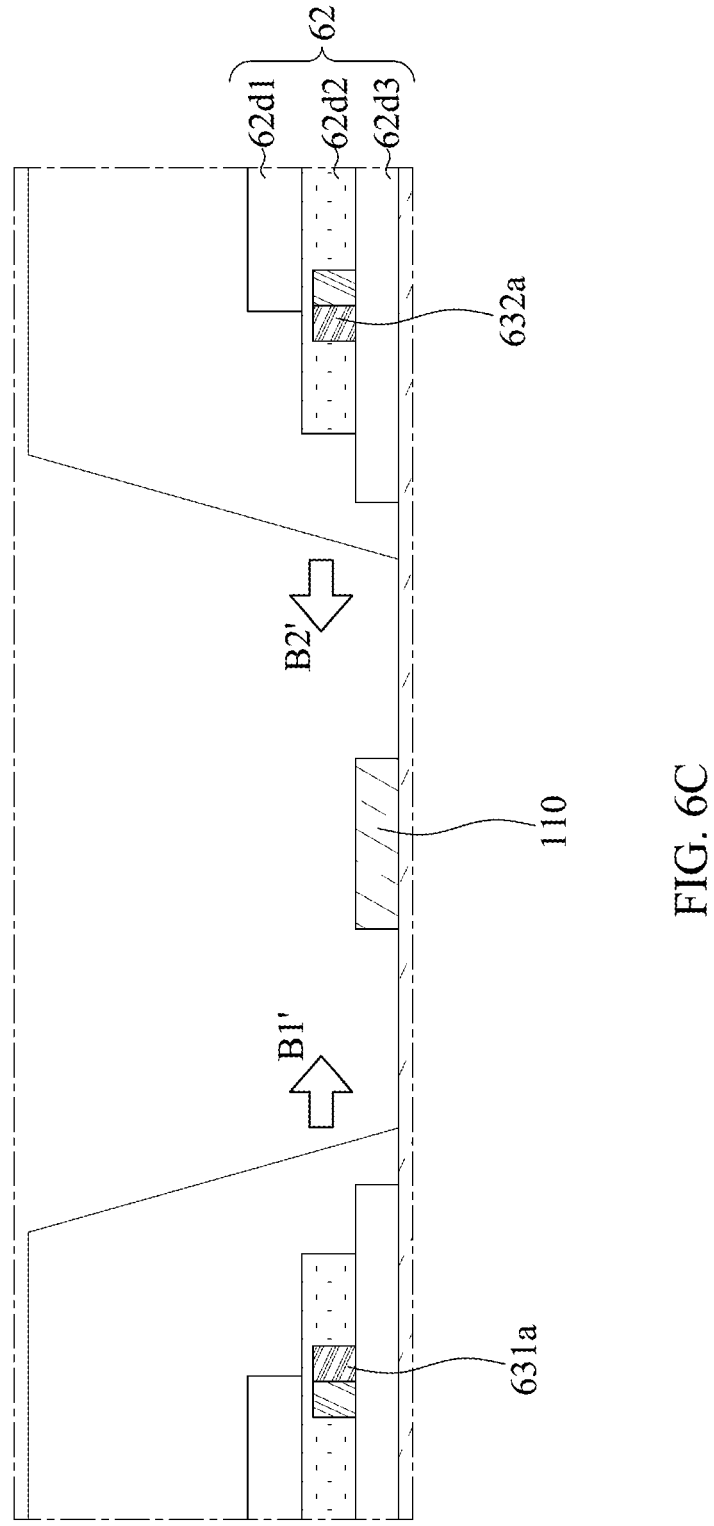
FIG. 6C is an enlarged perspective view of a region "C" in FIG. 6A according to another embodiment of the present disclosure.

FIG. 6C is an enlarged perspective view of a region "C" in FIG. 6A according to another embodiment of the present disclosure. FIG. 6C is similar to FIG. 6B, except that the magnets 631a and 632a of FIG. 6C are embedded in the RDL 62. In some embodiments, the magnets 631a and 632a may be embedded in one or more of the dielectric layers 62d1, 62d2, and 62d3 of the RDL 62. For example, the magnets 631a and 632a may be embedded in the dielectric layer 62d2 as illustrated in FIG. 6C.

FIG. 7A, FIG. 7B, FIG. 7C, FIG. 7D, FIG. 7E, FIG. 7F, and FIG. 7G illustrate one or more operations of a method for manufacturing a semiconductor device 1 according to some embodiments of the present disclosure.

Figure 7A:
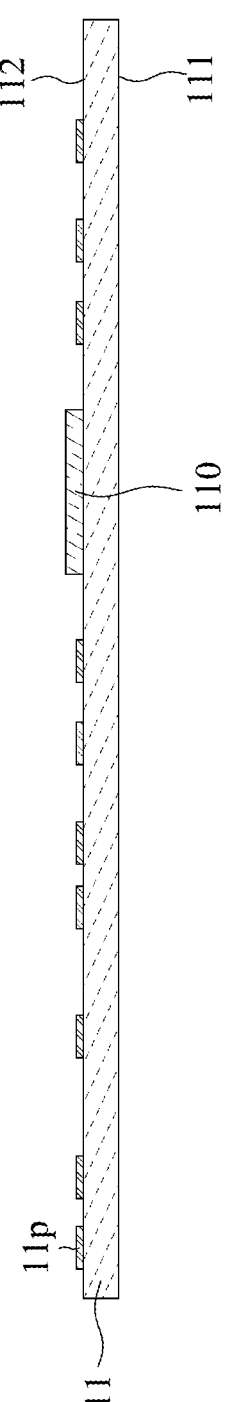
FIG. 7A, FIG. 7B, FIG. 7C, FIG. 7D, FIG. 7E, FIG. 7F, and FIG. 7G illustrate one or more operations of a method for manufacturing a semiconductor device 1 according to some embodiments of the present disclosure.

Referring to FIG. 7A, an optical transceiver 11 is provided. In some embodiments, the optical transceiver 11 may be in a wafer level or panel level. For example, there may be one or more optical transceivers 11 (not shown) in one wafer (or panel). The optical transceiver 11 has a first surface 111 (e.g., a backside surface) and a second surface 112 (e.g., an active surface) opposite to the first surface 111. The optical transceiver 11 has a sensing region 110 located at the second surface 112. The sensing region 110 may be embedded within the optical transceiver 11 or disposed on the second surface 112 of the optical transceiver 11. In some embodiments, the sensing region 110 can protrude from the second surface 112 of the optical transceiver 11. In some embodiments, the optical transceiver 11 can have one or more pads 11p disposed on the second surface 112.

Figure 7B:
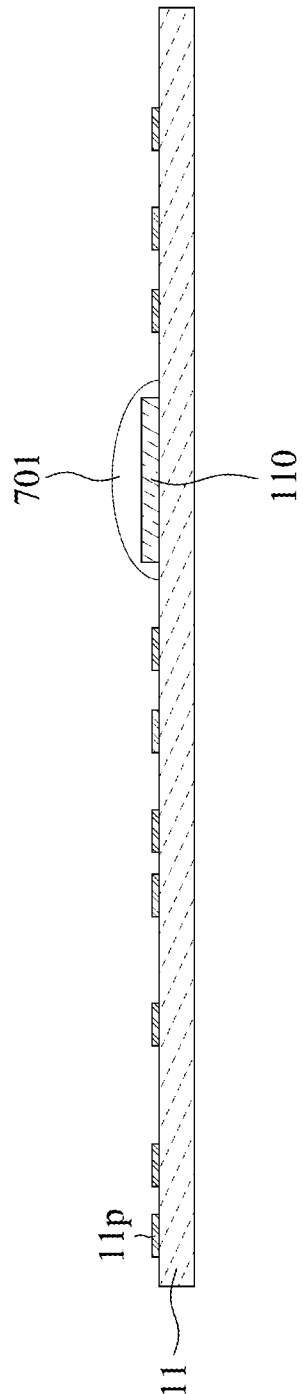

Referring to FIG. 7B, a protection material 701 is disposed on the second surface 112 of the optical transceiver 11 to cover the sensing region 110.

Figure 7C:
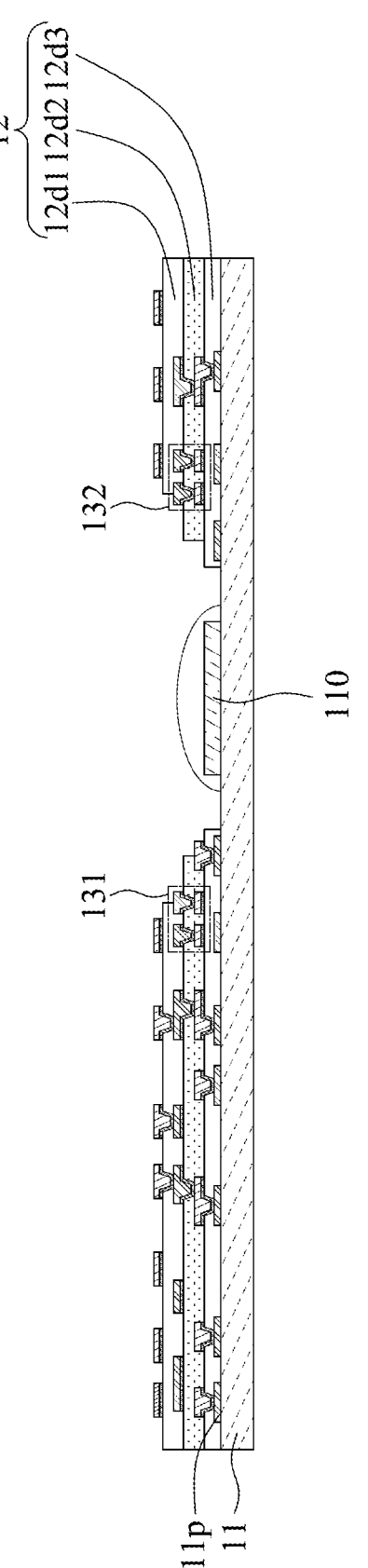

Referring to FIG. 7C, the RDL 12 including the dielectric layers 12d1, 12d2 and 12d3, pads, traces and conductive vias is formed on the optical transceiver 11 by carrying out the operations including exposure, development and plating. The RDL 12 has an opening to expose the sensing region 110 and the protection material 701. The components (or coils) 131 and 132 are formed at the same time and embedded in the RDL 12. The magnetic components 131 and 132 may be formed adjacent to or around the sensing region 110 of the optical transceiver 11.

Figure 7D:
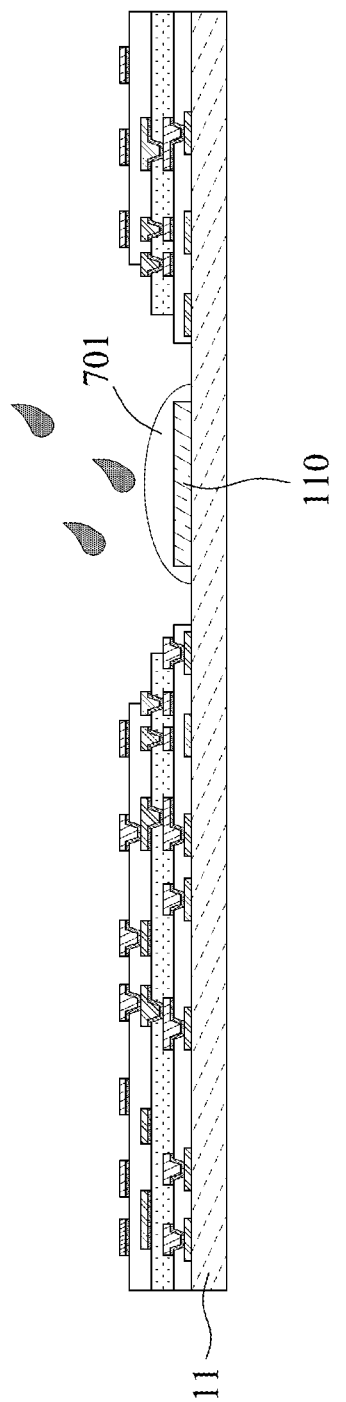

Referring to FIG. 7D, the protection material 701 is removed, for example, by etching. The protection material 701 may be removed after the final layer of the RDL 12 is formed.

Figure 7E:
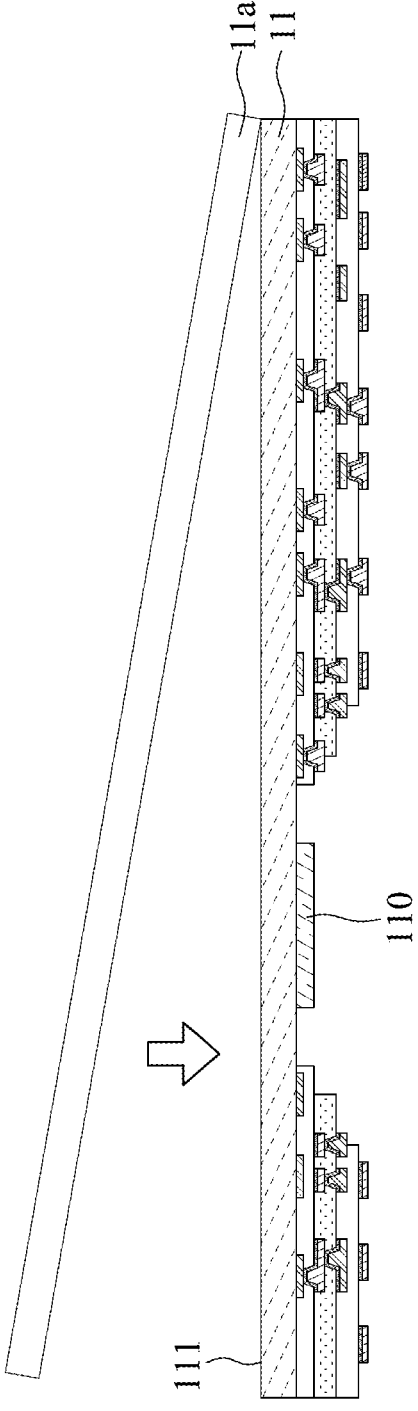

Referring to FIG. 7E, an adhesive 11a is disposed on the first surface 111 of the optical transceiver 11. In some embodiments, the resulting structure in FIG. 7D is placed upside down and the adhesive 11a is formed on the first surface 111 of the optical transceiver 11.

Figure 7F:
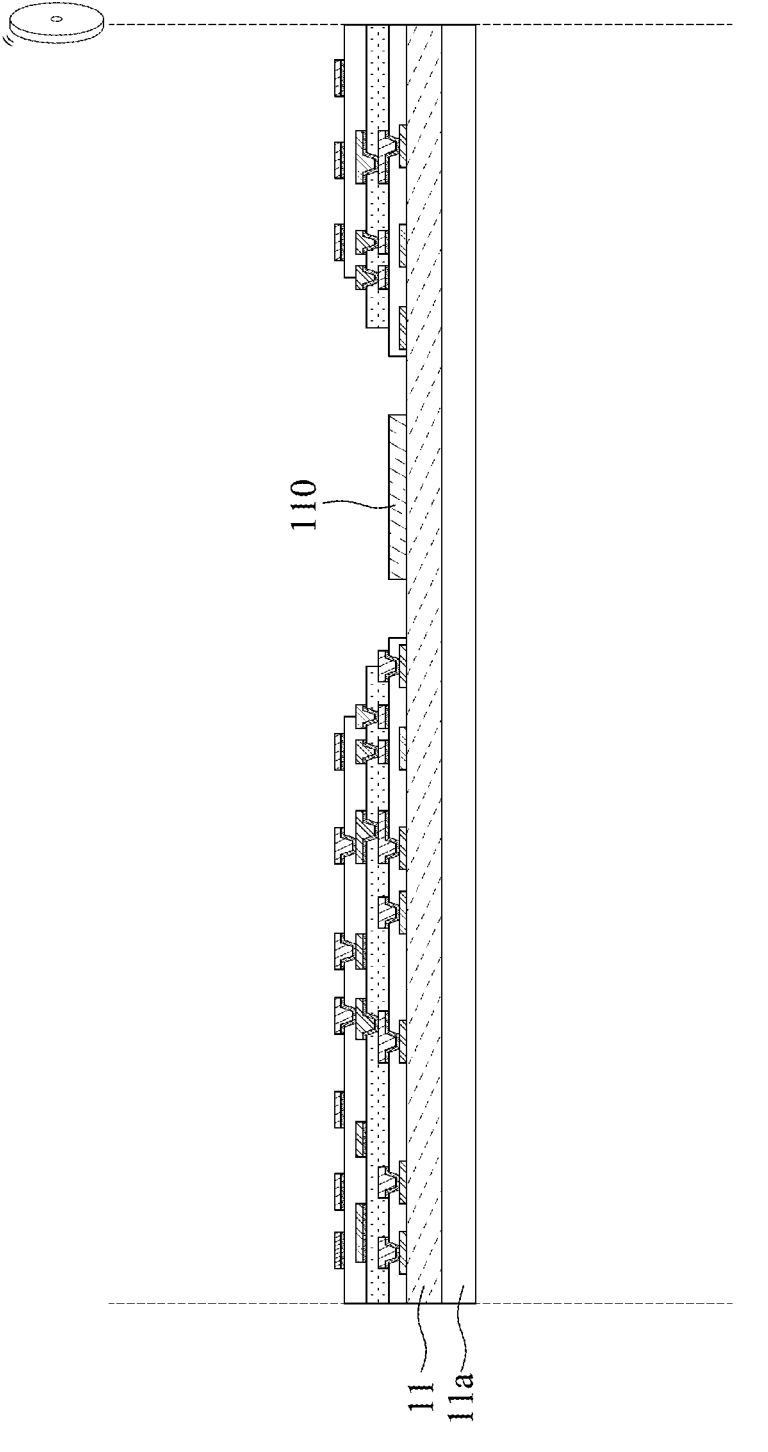

Referring to FIG. 7F, the resulting structure in FIG. 7E including the optical transceivers 11 may be singulated. In some embodiments, a dicing operation may be performed on the wafer or panel. In some embodiments, the dicing operation may be a sawing process.

Figure 7G:
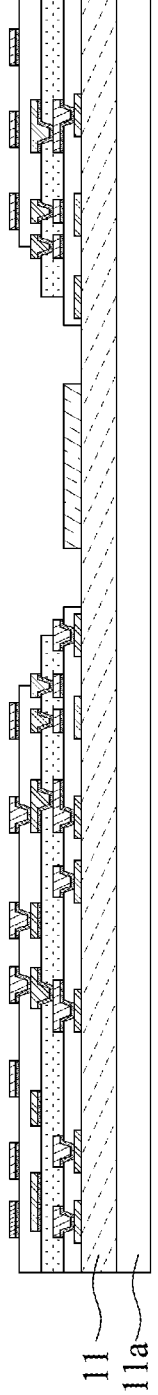

Referring to FIG. 7G, after the dicing operation is conducted, the semi-product 70 may be obtained for subsequent processes.

FIG. 8A, FIG. 8B, FIG. 8C, FIG. 8D, FIG. 8E, FIG. 8F, and FIG. 8G illustrate one or more operations of a method for manufacturing a semiconductor device 1 according to some embodiments of the present disclosure.

Figure 8A:
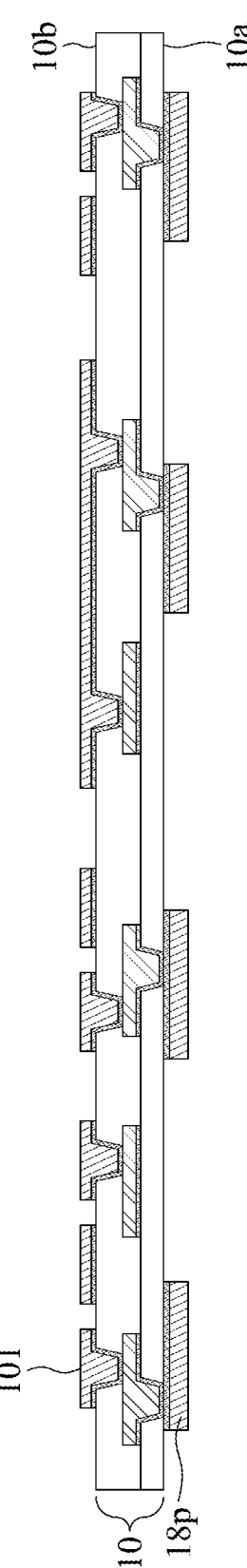
FIG. 8A, FIG. 8B, FIG. 8C, FIG. 8D, FIG. 8E, FIG. 8F, and FIG. 8G illustrate one or more operations of a method for manufacturing a semiconductor device 1 according to some embodiments of the present disclosure.

Referring to FIG. 8A, a substrate 10 is provided. In some embodiments, the substrate 10 may be multilayered. The substrate 10 has a bottom surface 10a and a top surface 10b opposite to the bottom surface 10a. The substrate 10 includes substrate pads 101 disposed on the top surface 10b. The substrate 10 includes pads 18p disposed on the bottom surface 10a.

Figure 8B:
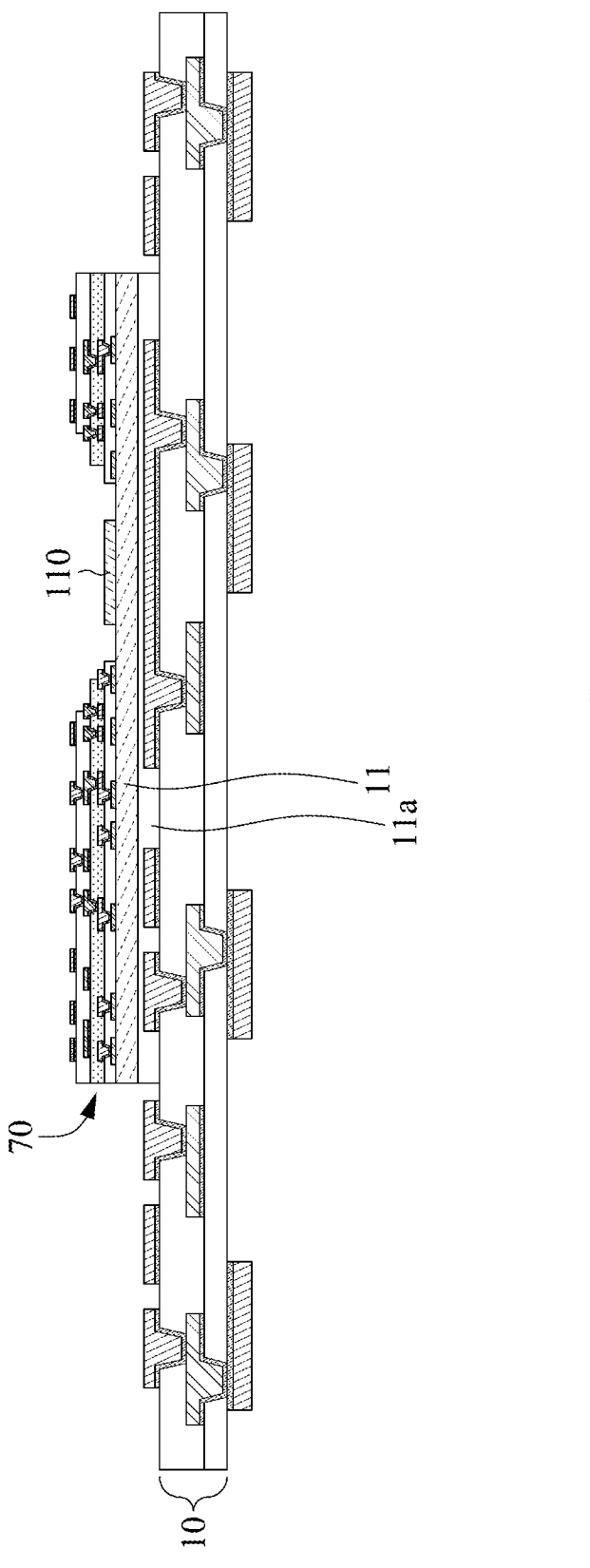

Referring to FIG. 8B, the semi-product 70 in FIG. 7G may be disposed on the top surface 10b of the substrate 10. The optical transceiver 11 may be attached to the substrate 10 through the adhesive 11a. In some embodiments, the sensing region 110 faces away from the substrate 10.

Figure 8C:
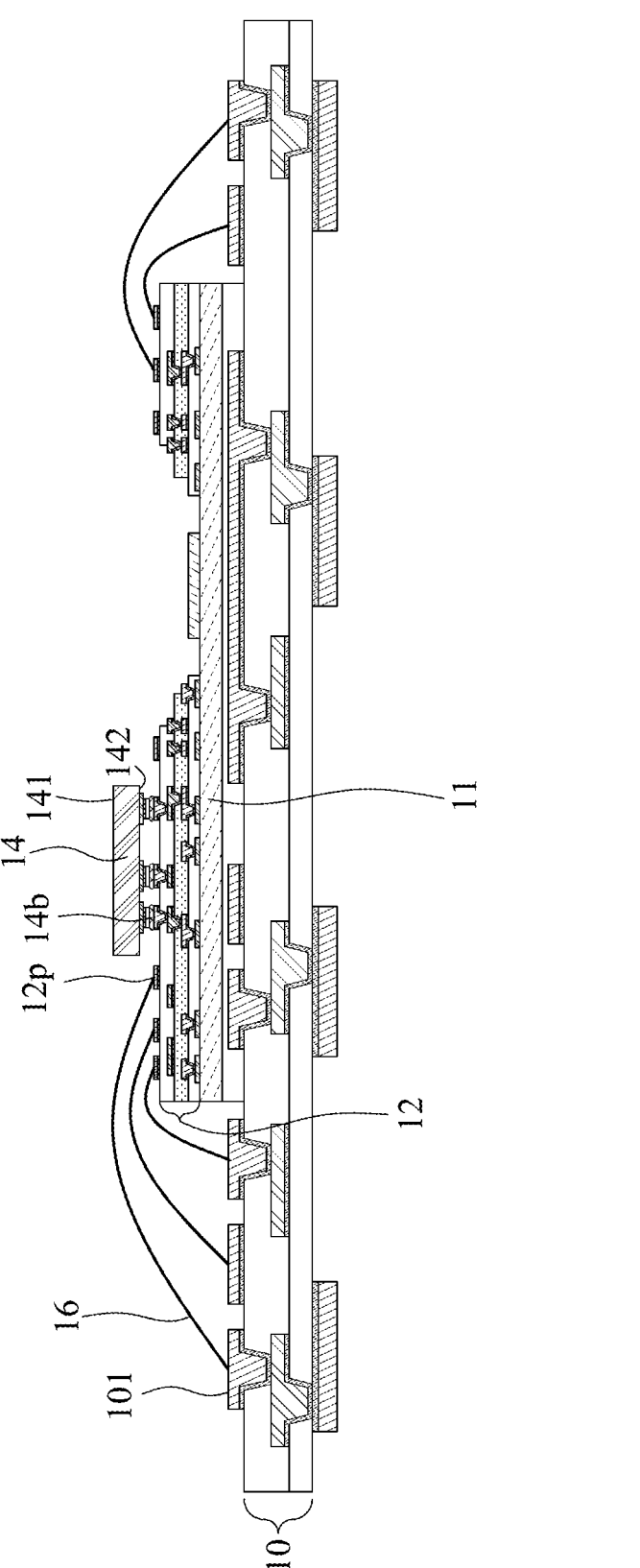

Referring to FIG. 8C, an electronic component 14 may be disposed on the RDL 12 electrically connected to the optical transceiver 11 through the RDL 12, and one or more conductive wires 16 are formed to electrically connect the RDL 12 and the substrate 10. The electronic component 14 may has a backside surface 141, an active surface 142 opposite to the backside surface 141, and one or more micro-bumps 14*b* disposed on the active surface 142. In some embodiments, micro-bumps 14*b* may be disposed between the electronic component 14 and the RDL 12, such that the electronic component 14 may be electrically connected to the RDL 12 through the micro-bumps 14*b*. In some embodiments, the conductive wires 16 can connect the pads 12*p* of the RDL 12 to the substrate pads 101.

Figure 8D:
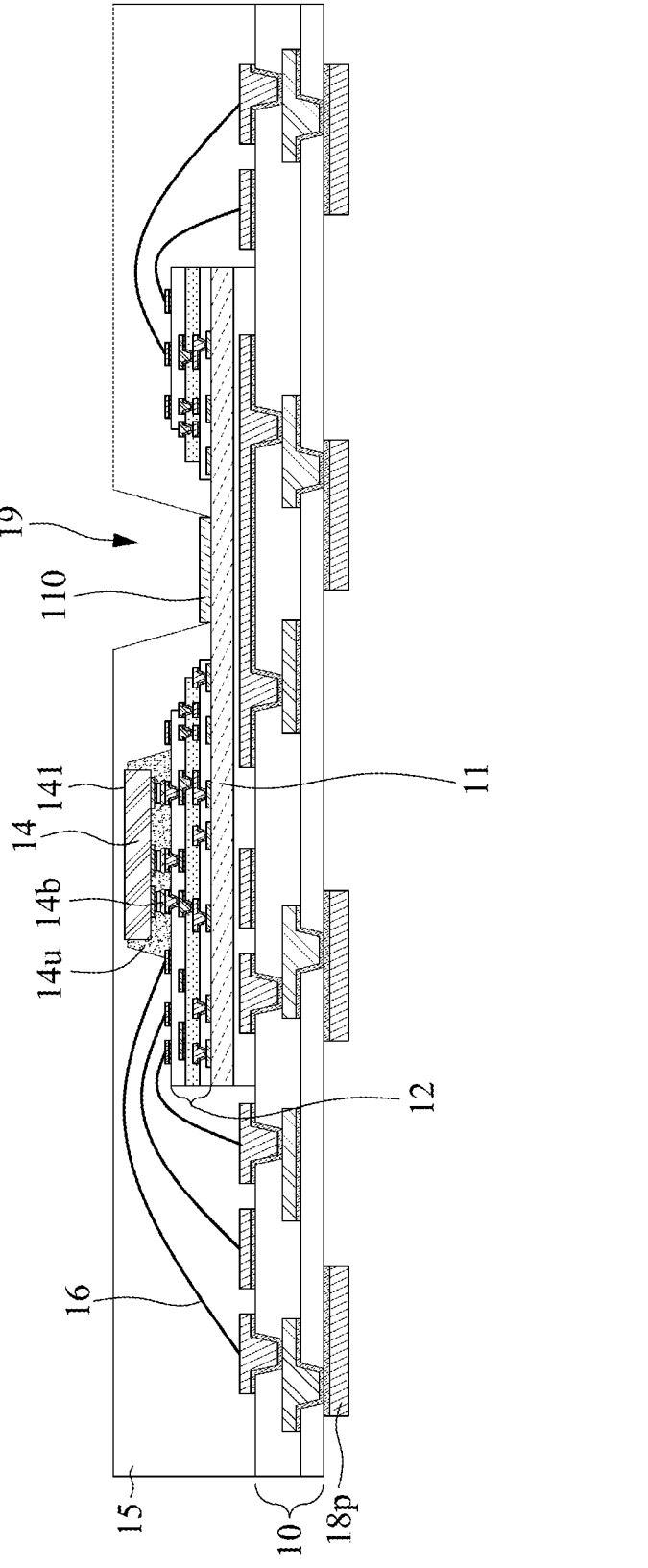

Referring to FIG. 8D, an underfill 14*u* may be formed between the electronic component 14 and the RDL 12 to encapsulate the micro-bumps 14*u* and an encapsulant 15 may be formed the substrate 10 to encapsulate the optical transceiver 11, the RDL 12, the electronic component 14, and conductive wires 16. The encapsulant 15 has an opening 19 exposing the sensing region 110 of the optical transceiver 11.

Figure 8E:
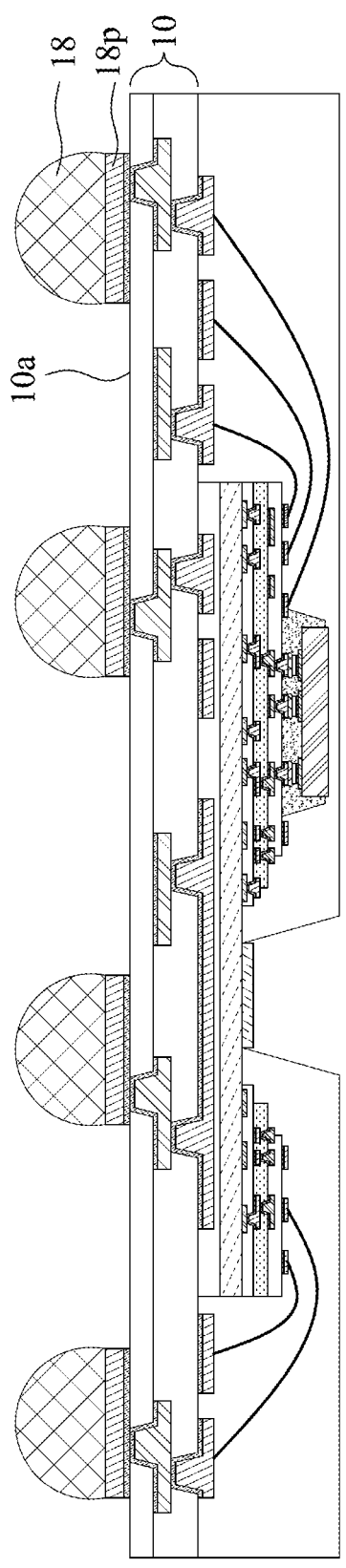

Referring to FIG. 8E, the resulting structure in FIG. 8D is placed upside down and external connectors (e.g., solder balls) 18 may be formed on the pads 18*p* of the substrate 10 for external electrical connection. In some embodiments, the external connecters 18 may be disposed on the pads 18*p* on the bottom surface 10*a* of the substrate 10.

Figure 8F:
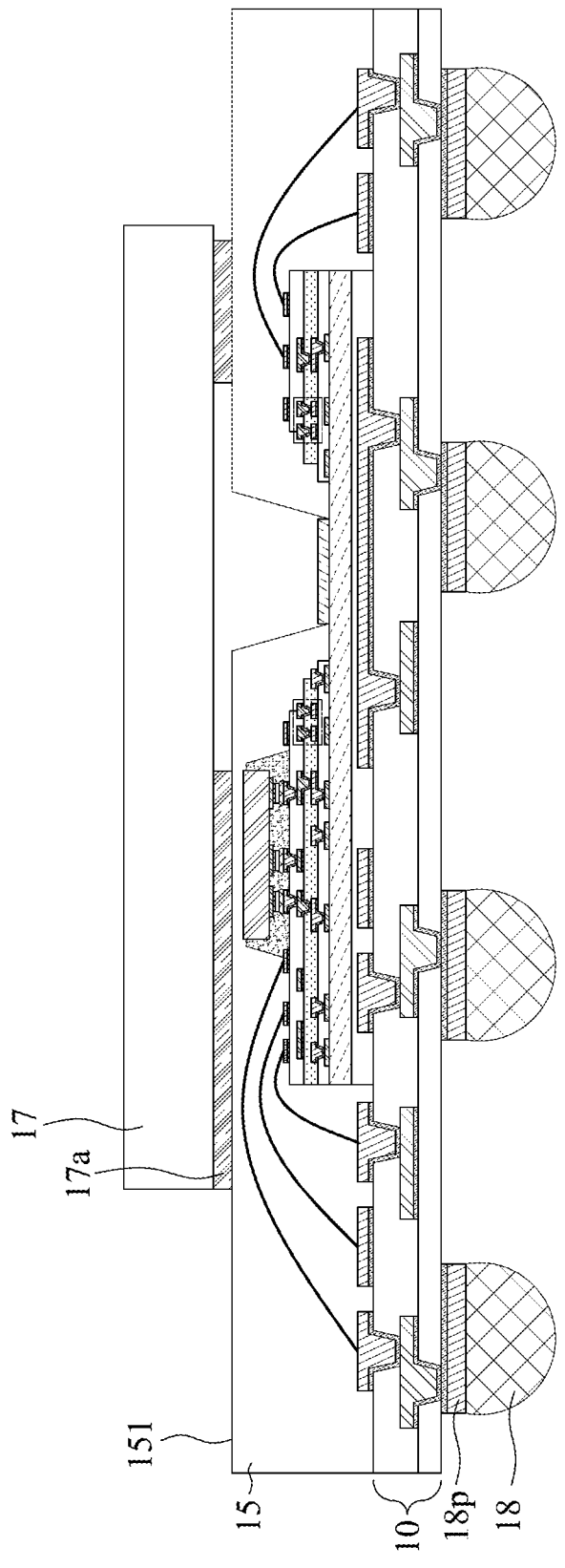

Referring to FIG. 8F, the resulting structure in FIG. 8E is placed upside down and an optical transceiver 17 may be disposed on the first surface (e.g., top surface) 151 of the encapsulant 15. The optical transceiver 17 may be bonded to the encapsulant 15 through an adhesive 17*a*.

Figure 8G:
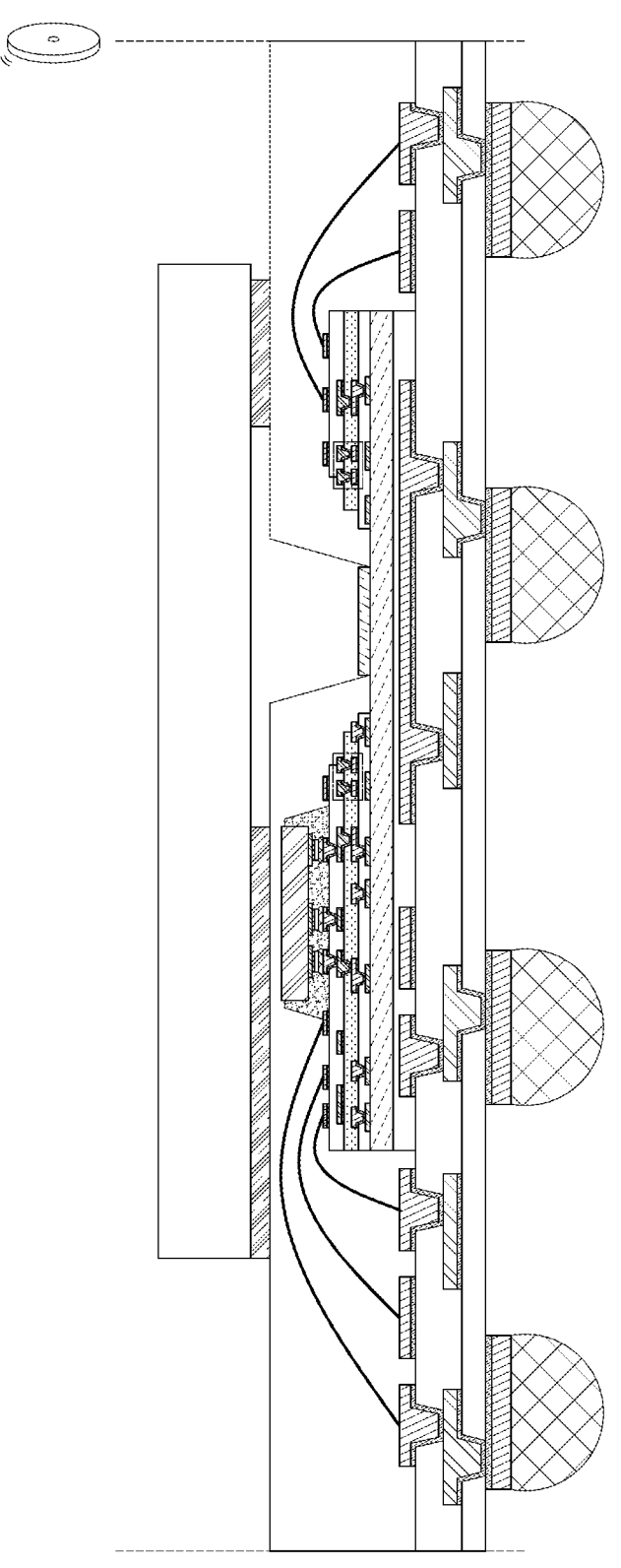

Referring to FIG. 8G, if necessary, a sawing or singulation process may be conducted on the resulting structure in FIG. 8F for singulation or removal of undesired portions. Then, a semiconductor device 1 as described and illustrated with reference to FIG. 1A is formed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein may be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value may be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to +0.5°, less than or equal to ±0.1°, or less than or equal to ±0.05°. For example, a characteristic or quantity may be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces may be deemed to be coplanar or substantially coplanar if a displacement between the two surfaces is no greater than 5 μm, no greater than 2 μm, no greater than 1 μm, or no greater than 0.5 μm. A surface may be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
a first optical transceiver;
a second optical transceiver;
a component configured to provide a magnetic field to change a light emitting direction from the first optical transceiver to the second optical transceiver or from the second optical transceiver to the first optical transceiver; and
an encapsulant covering the component and defining a light channel between the first optical transceiver and the second optical transceiver.

2. The semiconductor device of claim 1, wherein the component is disposed between the first optical transceiver and the second optical transceiver.

3. The semiconductor device of claim 1, wherein the first optical transceiver comprises a fiber array unit (FAU), and the second optical transceiver comprises a photonic integrated circuit (PIC) having a sensing region.

4. The semiconductor device of claim 3, further comprising an electronic integrated circuit (EIC) disposed between the FAU and the PIC, wherein the EIC is electrically connected to the PIC through the component.

5. The semiconductor device of claim 1, wherein the second optical transceiver comprises a sensing region, wherein the component is disposed around the sensing region.

6. The semiconductor device of claim 5, wherein the light channel has a first end and a second end opposite to the first end, wherein the second end is adjacent to the sensing region, and wherein the second end has an aperture greater than an aperture of the first end.

7. The semiconductor device of claim 1, wherein the second optical transceiver comprises a sensing region exposed from the light channel.

8. A semiconductor device, comprising:
a substrate;
a first optical transceiver disposed on the substrate;
a signal path modulation component disposed on the first optical transceiver and configured to regulate a direction of an optical signal toward or from the first optical transceiver by electrical current; and
a redistribution layer (RDL) disposed on the first optical transceiver, wherein the signal path modulation component is embedded in the RDL.

9. The semiconductor device of claim 8, wherein the first optical transceiver has a sensing region and the signal path modulation component is disposed around a periphery of the sensing region.

10. The semiconductor device of claim 9, wherein the signal path modulation component comprises a first optical signal path modulation element disposed adjacent to a first side of the sensing region and a second optical signal path modulation element disposed adjacent to a second side of the sensing region opposite to the first side.

11. The semiconductor device of claim 10, wherein the first signal path modulation element produces a first magnetic field toward the sensing region by a first electrical current and the second path modulation element provides a second magnetic field toward the sensing region by a second electrical current.

12. The semiconductor device of claim 8, further comprising an electronic component (EIC) disposed on the RDL and electrically connected to the first optical transceiver through the RDL.

13. The semiconductor device of claim 8, further comprising a second optical transceiver disposed over the first optical transceiver.

14. The semiconductor device of claim 13, wherein optical signals from the second optical transceiver are concentrated by the signal path modulation component before entering the first optical transceiver.

15. A semiconductor device, comprising:
an optical transceiver having a sensing region;
a redistribution structure disposed on the optical transceiver and defining an opening exposing the sensing region of the optical transceiver; and
an electronic component disposed on the redistribution structure;
wherein the redistribution structure comprises a first path for electrically connecting the electronic component with the optical transceiver and a second path for regulating a direction of an optical signal toward or from the optical transceiver.

16. The semiconductor device of claim 15, wherein the second path is in the form of a coil.

17. The semiconductor device of claim 16, wherein the redistribution structure comprises:
a first dielectric layer,
a plurality of first traces on the first dielectric layer,
a second dielectric layer on the first dielectric layer and covering the plurality of first traces, and
a plurality of second traces on the second dielectric layer,
a plurality of conductive vias penetrating the second dielectric layer
wherein the plurality of first traces and the plurality of second traces are connected by the plurality of conductive vias to form the coil.

* * * * *